(12) United States Patent
Uno et al.

(10) Patent No.: US 8,815,019 B2
(45) Date of Patent: Aug. 26, 2014

(54) BONDING WIRE FOR SEMICONDUCTOR

(75) Inventors: Tomohiro Uno, Tokyo (JP); Shinichi Terashima, Tokyo (JP); Takashi Yamada, Iruma (JP); Ryo Oishi, Iruma (JP); Daizo Oda, Iruma (JP)

(73) Assignees: Nippon Steel & Sumikin Materials., Ltd., Tokyo (JP); Nippon Micrometal Corporation, Saitama (JP)

( * ) Notice: Subject to any disclaimer, the term of this patent is extended or adjusted under 35 U.S.C. 154(b) by 435 days.

(21) Appl. No.: 12/993,401

(22) PCT Filed: Feb. 12, 2010

(86) PCT No.: PCT/JP2010/052029
§ 371 (c)(1),
(2), (4) Date: Feb. 1, 2011

(87) PCT Pub. No.: WO2010/106851
PCT Pub. Date: Sep. 23, 2010

(65) Prior Publication Data
US 2011/0120594 A1    May 26, 2011

(30) Foreign Application Priority Data
Mar. 17, 2009    (JP) .................................. 2009-063874

(51) Int. Cl.
*B23K 35/34*    (2006.01)
(52) U.S. Cl.
USPC .............................. 148/23; 257/762; 428/576
(58) Field of Classification Search
USPC ........... 228/110.1; 148/23; 428/576; 257/762
See application file for complete search history.

(56) References Cited

U.S. PATENT DOCUMENTS

2004/0245320 A1* 12/2004 Fukagaya et al. .......... 228/110.1

FOREIGN PATENT DOCUMENTS

| CN | 1575512 A | 2/2005 |
|---|---|---|
| JP | 62-97360 A | 5/1987 |
| JP | 63-244660 A | 10/1988 |
| JP | 4-79236 A | 3/1992 |
| JP | 4-79240 A | 3/1992 |
| JP | 4-79242 A | 3/1992 |
| JP | 5-175272 A | 7/1993 |
| JP | 2004-6740 A | 1/2004 |
| JP | 2006-100777 A | 4/2006 |
| JP | 2006-216929 A | 8/2006 |
| JP | 2007-12776 A | 1/2007 |
| WO | 02/23618 A1 | 3/2002 |

OTHER PUBLICATIONS

I. Singh, et al., Enhancing Fine Pitch, High I/O Devices with Copper Ball Bonding, Electronic Components and Technology Conference, 2005, pp. 843-847.

* cited by examiner

*Primary Examiner* — Weiping Zhu
(74) *Attorney, Agent, or Firm* — Troutman Sanders LLP

(57) ABSTRACT

It is an object of the present invention to provide a multilayer wire which can accomplish both ball bonding property and wire workability simultaneously, and which enhances a loop stability, a pull strength, and a wedge bonding property. A semiconductor bonding wire comprises a core member mainly composed of equal to or greater than one kind of following elements: Cu, Au, and Ag, and an outer layer formed on the core member and mainly composed of Pd. A total hydrogen concentration contained in a whole wire is within a range from 0.0001 to 0.008 mass %.

21 Claims, 2 Drawing Sheets

BONDING WIRE FOR SEMICONDUCTOR

CROSS REFERENCE TO PRIOR APPLICATIONS

This application is a U.S. National Phase application under 35 U.S.C. §371 of International Application No. PCT/JP2010/052029, filed on Feb. 12, 2010 and claims benefit of priority to Japanese Patent Application No. 2009-063874, filed on Mar. 17, 2009. The International Application was published in Japanese on Sep. 23, 2010 as WO 2010/106851 A1 under PCT Article 21(2). All these applications are herein incorporated by reference.

TECHNICAL FIELD

The present invention relates to a semiconductor bonding wire used for connecting an electrode on a semiconductor device and a wiring of a circuit wiring board (a lead frame, a substrate, a tape, etc.), together.

BACKGROUND ART

Recently, thin wires each having a wire diameter of 20 to 50 μm or so are popularly used as semiconductor bonding wires (hereinafter, referred to as bonding wires) for connecting an electrode on a semiconductor device and an external terminal together. A thermal compressive bonding technique with the aid of ultrasound is generally applied to bond bonding wires, and a general-purpose bonding device, and a capillary jig which allows a bonding wire to pass through the interior thereof for connection are used. A leading end of a bonding wire is heated and melted by arc heat inputting, a ball is formed by surface tension, and then the ball is compressively bonded on an electrode of a semiconductor device heated within a range from 150 to 300° C. beforehand. Thereafter, the bonding wire is directly bonded to an external lead by ultrasound compressive bonding.

Recently, technologies related to the structure, material and connection for the semiconductor mounting technologies are rapidly diversified, and for example, in a mounting structure technology, in addition to currently used QFP (Quad Flat Packaging) using a lead frame, new configurations, such as BGA (Ball Grid Array) using a substrate, a polyimide tape or the like and CSP (Chip Scale Packaging), are practically used, and a bonding wire which has improved the loop characteristic, the bonding property, the mass productivity, the usability, etc., becomes requisite. Regarding the connection technology of such a bonding wire, in order to directly bond a bonding wire at two locations, improvement of the bonding property of thin wires becomes requisite not only for ball/wedge bonding which is a currently popular bonding technique but also for wedge/wedge bonding appropriate for accomplishment of a fine diameter.

Materials of an object subjected to be bonded with a bonding wire are also diversified, and for a wiring on a silicon substrate and an electrode material, in addition to an Al alloy conventionally used, copper is now in practical use which is more appropriate for refined wiring. Moreover, an Ag plating, a Pd plating, etc., are applied on a lead frame, and a copper wiring is formed on a resin substrate, a tape, etc., and a film of a noble metal element like gold or an alloy thereof is often formed on such plating and wiring. It is requisite to improve the bonding property of a bonding wire and the reliability of a bonded part depending on the kinds of an object subjected to be bonded with the bonding wire.

From the standpoint of a requisition for a wire bonding technology, it is important to form a ball with a good sphericity having a clean surface at the time of ball formation, and to accomplish a sufficient bonding strength at a bonded part between the ball and an electrode. Moreover, in order to cope with lowering of a bonding temperature and thinning of a bonding wire, a bonding strength and a tensile strength at a portion where a bonding wire is subjected to wedge bonding to a wiring part on a circuit wiring substrate are also important factors.

As wire characteristics that satisfy the foregoing requisitions, it is desirable to comprehensively satisfy various characteristics such that a loop control is facilitated in a bonding process, a joining property to an electrode and to a lead is improved, any excessive wire deformation in a resin encapsulation process after bonding is suppressed, and a long-term reliability of a bonded part and a stability of the bonded part under a severe circumstance are assured.

So far, 4N-group having a high purity (purity>99.99 mass %) is mainly used as a material of bonding wires. In order to improve strength and a bonding property, a tiny amount of alloy elements are prepared. Recently, a gold alloy wire with a purity of 2N (purity>99%) having a an additive element concentration increased up to less than or equal to 1% has been put into practical use in order to improve the reliability of a bonded part. The strength can be improved and the reliability can be controlled by adjusting the kind and the concentration of an alloy element added to gold. Conversely, alloying may cause deterioration of a bonding property and increase of an electrical resistance, so that it is difficult to comprehensively satisfy various characteristics requisites for the bonding wires.

Moreover, because gold is expensive, other kinds of metal which have a low material cost are desired, and bonding wires made of copper which have a low material cost and which have a good electrical conductivity are created. According to the copper bonding wires, however, a bonding strength is deteriorated due to oxidization of a wire surface, and a wire surface is likely to be corroded when encapsulated in a resin. These are the reasons why practical usage of the copper bonding wires is not accelerated. The silver bonding wires have such advantages that silver is inexpensive than gold, has the highest electrical conductivity, and enables ball formation in an atmosphere, but has such disadvantages that the bonding reliability at a high temperature is slightly poor in comparison with Au, and is likely to be effected by sulfuration of a wire surface.

All bonding wires in practical use so far have a monolayer structure. Even if materials, such as gold and copper, are changed, alloy elements are uniformly contained in a bonding wire, and all wires employ a wire monolayer structure as viewed from a cross section of the bonding wires. A thin native oxide film, an organic film, etc., for protecting a surface may be formed on the wire surface of a bonding wire in some cases, but these are restricted in an extremely-thin region up to several atomic layer level) in an outermost surface.

In order to meet various needs requisites for the bonding wires, a bonding wire with a multilayer structure in which a wire surface is coated with another metal is proposed.

Bonding wires made of copper which has inexpensive material cost, has a good electrical conductivity, and ensures ball bonding and wedge bonding, etc., are created, and for example, patent literature 1 is disclosed. According to copper bonding wires, however, a bonding strength is deteriorated due to oxidization of a wire surface, and a wire surface is likely to be corroded when encapsulated in a resin. These are the reasons why practical usage of the copper bonding wires is not accelerated.

In the case of copper bonding wires, when the leading end of a wire is melted to form a ball, bonding is carried out while a gas is sprayed to the leading end of the wire in order to suppress any oxidization. Recently, a nitrogen gas containing 5 vol % of hydrogen is popularly used as an atmosphere gas at the time of ball formation of copper bonding wires. Patent literature 2 discloses that a copper wire is connected under 5 vol % $H_2+N_2$ when connected to a copper or copper-alloy lead frame. Moreover, it is reported in non-patent literature 1 that a 5 vol % $H_2+N_2$ gas is more desirable than an $N_2$ gas because such a gas can suppress any oxidization of a ball surface at the time of ball formation in the case of copper bonding wires. Nowadays, a 5 vol % $H_2+N_2$ gas is standardized as a gas used when copper bonding wires are used.

As a technique of suppressing any oxidization of a surface of a copper bonding wire, patent literature 1 discloses a bonding wire in which copper is coated with a noble metal or a corrosion-resistant metal, such as gold, silver, platinum, palladium, nickel, cobalt, chrome, and titanium. Moreover, from the standpoint of a ball formability and suppression of any deterioration of a plating solution, patent literature 3 discloses a bonding wire so structured as to have a core member mainly composed of copper, a dissimilar metal layer formed on the core member and made of a metal other than copper, and a coating layer thrilled on the dissimilar metal layer and made of an oxidization-resistant metal having a higher melting point than that of copper. Patent literature 4 discloses a bonding wire comprising a core member mainly composed of copper, and an outer skin layer which contains a metal, having either one of or both of a constituent and a texture different from the core member, and copper, and which is a thin film having a thickness of 0.001 to 0.02 μm.

Various gold bonding wires with a multilayer structure have been also proposed. For example, patent literature 5 discloses a bonding wire comprising a core wire formed of highly pure Au or an Au alloy, and a coating material coating the outer circumference surface of the core wire and formed of a highly pure Pd or a Pd alloy. Patent literature 6 discloses a bonding wire comprising a core wire formed of highly pure Au or an Au alloy, and a coating material coating the outer circumference surface of the core wire and formed of highly pure Pt or a Pt alloy. Patent literature 7 discloses a bonding wire comprising a core wire formed of highly pure Au or an Au alloy, and a coating material coating the outer circumference surface of the core wire and formed of highly pure Ag or an Ag alloy.

It is desirable to cope with the most-advanced fine diameter technique and the high-density packaging technique like three-dimensional wiring by comprehensively satisfying such characteristics that loop control is stable in a bonding process, a bonding property is improved, any deformation of a bonding wire at the time of resin encapsulation is suppressed, and a long-term reliability of a bonded part is accomplished as wire characteristics of a bonding wire of mass-production.

Regarding ball bonding, it is important to form a ball with a good sphericity at the time of ball formation, and to obtain a sufficient bonding strength at a bonded part between the ball and an electrode. Moreover, in order to cope with lowering of a bonding temperature and thinning of a bonding wire, a bonding strength, a tensile strength, etc., are requisites at a portion where a bonding wire is wedge bonded to a wiring part on a circuit wiring substrate.

There is no report so far that such bonding wires with a multilayer structure are subjected to mass-production and popularly used, and the manufacturing technology thereof has not been established yet in the industries. Material designing and development of manufacturing technology are desired in order to improve the mass-production yield, the productivity, the quality stability, etc., of bonding wires with a multilayer structure.

PRIOR ART DOCUMENTS

Patent Literatures

Patent literature 1: JPS62-97360A
Patent literature 2: JPS63-244660A
Patent literature 3: JP2004-6740A
Patent literature 4: JP2007-12776A
Patent literature 5: JPH04-79236A
Patent literature 6: JPH04-79240A
Patent literature 7: JPH04-79242A Non-Patent Literature Non-patent literature 1: L Singh, J. Y. On, L. Levine. "Enhancing finepitch, high I/O devices with copper ball bonding", th Proceedings ECTC 2005, 843 to 847

DISCLOSURE OF INVENTION

Problems to be Solved by the Invention

According to the conventional bonding wires with a monolayer structure (hereinafter, referred to as a monolayer wire), addition of an alloy element is effective to improve a tensile strength, a strength of a bonded part, a reliability thereof, etc., but it is thought that there is a limit in improvement of the characteristics. According to the bonding wires with a multilayer structure (hereinafter, referred to as a multilayer wire), it is anticipated that the characteristics are further improved, in comparison with the monolayer wire to improve an added value. Regarding the multilayer wires bringing about a high functionality, a wire surface can be coated with a noble metal or an oxidation-resistant metal to suppress any oxidization of a surface of a copper bonding wire. For gold bonding wires, it is also anticipated to accomplish an effect of reducing resin sweep by coating a wire surface with a metal or an alloy having a h all strength. In the case of silver bonding wires, as a wire surface is coated with a metal or an alloy having a high strength, a bonding strength of a ball or a bonding wire itself can be improved.

For a core member mainly composed of at least one of Cu, Au and Ag, when a noble metal coating the surface of the core member is Pd, it is expected requisitions are comprehensively satisfied such as suppression of any oxidization, a bonding property to an electrode, adhesiveness to an encapsulation resin, and a relatively inexpensive material cost, etc.

The inventors of the present invention carried, out a test in consideration of the needs for high densification, miniaturization, thinning, etc., of the semiconductor mounting technique, and it became clear that multilayer wires having the surface of a bonding wire coated with Pd still have various practical problems to be discussed later.

In manufacturing of the multilayer wires having Pd coating layer and a core member both made of materials with different mechanical characteristics, the Pd coating layer may be peeled and become missing during processing and annealing. If the adhesiveness between the Pd coating layer and the core member is insufficient, peeling and missing of the Pd coating layer also occur in a wire bonding process performing complex loop control. Merely a partial elimination of the coating layer which causes the core member to be exposed, at the surface of a bonding wire results in a quality issue, such as progression of oxidization or reduction of a bonding property.

In addition to such direct defect, indirect defect originating from peeling and missing of the coating layer or reduction of yield are also maters of concerns. For example, it is difficult to completely find a scratch or a scraping once produced in the halfway of manufacturing of multilayer wires at the time of product shipment. As the skin layer has nonuniform thickness and any internal cracks remain in a wire, failures, such as fall down, cast down, bend down, etc., at the time of loop formation occur. Such defect results in reduction of yield in a bonding process although any causal correlation with peeling and missing of the coating layer is hardly recognized.

In the case of multilayer bonding wires having a Pd coating layer which is harder than the core member mainly composed of Cu, Au and Ag, and which is likely to be brittle, the rate of occurrence of troubles in manufacturing is large during a wire mass-production process and a successive bonding process of lame number of wires in comparison with the case of monolayer wires. Because worn-out of a roll and a dice during a process of rolling and drawing of multilayer wires is intense, any scratch is formed on a wire surface, resulting in a quality issue or increase of a manufacturing cost due to short-lifetime of the dice. Moreover, as complex loop control is performed in a wire bonding process, the internal wall of an opening of a capillary is rubbed by the Pd coating layer, and the replacement frequency of capillary increases in comparison with the case of monolayer wires, resulting in reduction of the productivity.

When a ball is formed using a multilayer wire, occurrence of a flat ball out of sphericity, concavity and convexity of a ball surface, air bubble in the ball, or a tiny pore in the ball surface, etc., becomes a problem. If such an abnormal ball is bonded on an electrode, off-centering deformation that a ball is shifted from the center of a wire and deformed, and elliptical deformation and petal-like deformation which are examples of a shape failure out of sphericity occur, so that a bonded part spreads out of an electrode surface, which becomes a cause of reduction of a bonding strength, a chip damage, and a failure in management of manufacturing. Such initial bonding failure may bring about reduction of the long-term reliability of a ball bonded part under a high-temperature and high-humidity environment. One factor has been an effect of residual impurities and gas components in the interior of an outer layer and in the vicinity of an interface between the outer layer and the core member during a manufacturing process of multilayer wires.

Regarding deterioration of the quality, reduction of the lifetime of a dice, increase of the replacement frequency of capillary, and shape failure at the time of ball bonding all inherent to peeling and missing of the Pd coating layer, no effective action against such defects is known so far. Regarding such defects, it is difficult to recognize a problem in evaluation of a little amount of wires prior to practical usage, but such a problem becomes obvious when strict management in the order of ppm is carried out in a mass-production process. This has been a minor problem as there is no practical accomplishment of the use of the multilayer wires as semiconductor bonding wires, but from now on, there is an expectation to overcome such a problem in order to realize mass-production of the multilayer wires and practical use thereof.

It is an object of the present invention to overcome the foregoing problems of the prior art, and to provide a semiconductor bonding wire which accomplishes improvement of performances, such as suppression of any peeling and missing of a coating layer on a wire surface, improvement of a work property, improvement of a ball bonding property, stabilization of a loop shape, and extension of a dice lifetime or a capillary replacement lifetime.

Means for Solving the Problem

The inventors of the present invention keenly studied about multilayer wires in order to overcome the foregoing problems, and found out that it is effective to make a concentration of hydrogen contained in a bonding wire appropriate. Moreover, the inventors found that it is further effective to control the thickness of an outer layer or a diffusion layer, addition of alloy elements in a core member, etc.

The present invention has been made based on the foregoing finding, and employs the following structures.

A semiconductor bonding wire according to a first aspect of the present invention comprises: a core member mainly composed of at least any one of CU, Au and Ag; an outer layer formed on the core member and mainly composed of Pd, wherein a total concentration of hydrogen contained in a whole wire is within a range from 0.0001 to 0.008 mass %.

According to a second aspect of the present invention, in the semiconductor bonding wire of the first aspect, the total concentration of hydrogen is within a range from 0.0001 to 0.004 mass %.

According to a third aspect of the present invention, in the semiconductor bonding wire of the first or second aspect, the total concentration of hydrogen is a concentration of hydrogen contained in the bonding wire measured by Thermal Desorption Spectrometry (TDS).

According to a fourth aspect of the present invention, in the semiconductor bonding wire according to any one of first to third aspects, in a TDS measurement at a temperature rising speed of 100 to 300° C./h, a ratio of a concentration of hydrogen, detected within a temperature range from 150 to 500° C. in TDS, to the total concentration of hydrogen detected within a total measured temperature range is equal to or larger than 50%.

According to a fifth aspect of the present invention, in the semiconductor bonding wire according to any one of first to fourth aspects, the outer layer has a thickness being within a range from 0.01 to 0.2 µm.

According to a sixth aspect of the present invention, in the semiconductor bonding wire according to any one of first to fifth aspects, in the outer layer, a region having a concentration of Pd relative to a total concentration of metal elements being equal to or larger than 80 mol % has a thickness of 0.003 to 0.08 µm.

According to a seventh aspect of the present invention, the semiconductor bonding wire according to any one of first to sixth aspects further comprises a diffusion layer formed between the outer layer and the core member and having a concentration gradient, wherein the diffusion layer has a thickness of 0.003 to 0.15 µm.

According to an eighth aspect of the present invention, in the semiconductor bonding wire according to any one of first to seventh aspects, the main constituent of the core member is Cu or Au, and the core member also contains at least one of Pd, Ag and Pt as an element, and a total concentration of the elements in the core member is within a range from 0.01 to 2 mol %.

According to a ninth aspect of the present invention, in the semiconductor bonding wire according to any one of first to eighth aspect, the main constituent of the core member is Cu, and the core member contains at least one of Al, Sn, Zn, B and P as an element for alloy, and a total concentration of the elements for alloy in a whole wire is within a range from 0.0001 to 0.05 mol %.

According to a 10th aspect of the present invention, in the semiconductor bonding wire according of the first aspect, the core member is mainly composed of Cu, and the semiconductor bonding wire further comprises a concentrated layer formed at a surface side of the outer layer and containing at least either one of Ag and Au.

According to an 11th aspect of the present invention, in the semiconductor bonding wire according to the 10th aspect, the concentrated layer has a concentration gradient of at least either one of Ag and Au, in a wire diameter direction.

According to a 12th aspect of the present invention, in the semiconductor bonding wire according to the 10th aspect, a concentration of Pd at an outermost surface of the concentrated layer is within a range from 0 to 90 mol %.

According to a 13th aspect of the present invention, the semiconductor bonding wire according to the 10th aspect further comprises a Pd single-metal layer in the outer layer.

According to a 14th aspect of the present invention, in the semiconductor bonding wire according to the 10th aspect, the outer layer including the concentrated layer has a thickness of 0.02 to 0.4 μm.

According to a 15th aspect of the present invention, in the semiconductor bonding wire according to the first aspect, the core member is mainly composed of Cu, the semiconductor bonding wire further comprises an intermediate layer formed between the core member and the outer layer, and wherein at least either one of Ag and Au is concentrated in the intermediate layer.

According to a 16th aspect of the present invention, in the semiconductor bonding wire according to the 15th aspect, the intermediate layer has a concentration gradient of at least either one of Ag and Au, in a wire diameter direction.

According to a 17th aspect of the present invention, in the semiconductor bonding wire according to the 5th aspect, a maximum total concentration of Ag and Au in the intermediate layer is within a range from 30 to 90 mol %.

According to an 18th aspect of the present invention, in the semiconductor bonding wire according to the 16th aspect, the intermediate layer includes a region where Pd, Cu, and at least either one of Ag and Au coexist, the region having a concentration gradient of at least three of the elements in a wire diameter direction.

According to a 19th aspect of the present invention, in the semiconductor bonding wire according to the 15th aspect, a total thickness of the outer layer and the intermediate layer is within a range from 0.02 to 0.5 μm.

According to a 20th aspect of the present invention, in the semiconductor bonding wire according to 10th or 15th aspect, a total concentration of Pd, Ag and Au is within a range from 0.4 to 4 mol %.

According to a 21st aspect of the present invention, in the semiconductor bonding wire according to 10th or 15th aspect, a ratio of a total concentration of Ag and Au to a concentration of Pd is within a range from 0.001 to 0.4.

Effect of the Invention

According to a bonding wire with a multilayer structure, improvement of both sphericity of a ball and workability of a wire can be accomplished. Moreover, stabilization of a compressive bonded shape at a ball bonded part can be promoted. Furthermore, a successive bonding property after a wire is left in an atmosphere for a long time can be improved. Still further, a pull strength can be improved. Yet further, a loop linearity or a leaning characteristic can be improved. Also, the reliability in a high-temperature and high-humidity test can be improved. As a result, it becomes possible to provide a sophisticated semiconductor bonding wire that can cope with most-advanced semiconductor mounting technologies, such as thinning, accomplishment of a fine diameter, accomplishment of a long span, and accomplishment of a high reliability.

BEST MODE FOR CARRYING OUT THE INVENTION

Figure 1:
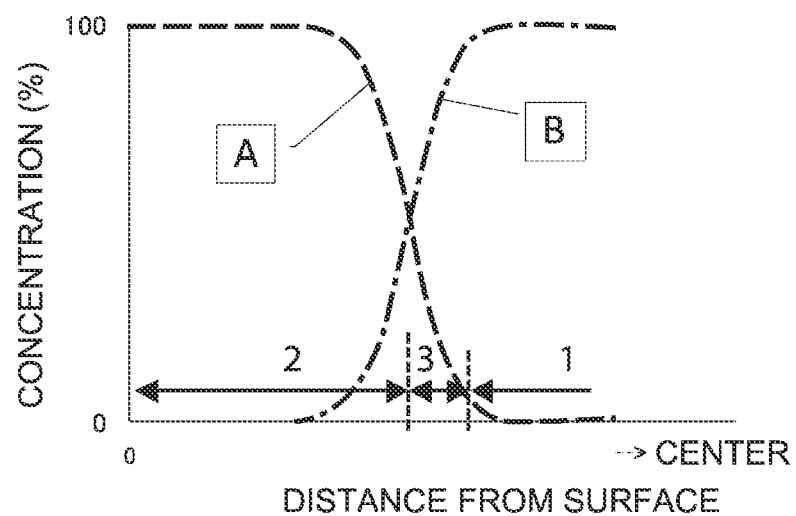
FIG. 1 is a diagram showing a concentration profile of a bonding wire having an outer layer, a diffusion layer, and a core member.

Regarding semiconductor bonding wires (hereinafter, referred to as bonding wires), evaluation was made for wires each comprising a core member made of an electrically conductive metal and an outer layer formed on the core member and mainly composed of Pd. As a result, it was found that suppression of any oxidization, a wedge bonding property or a long-term bonding reliability was improved, but peeling and missing of an outer layer and bonding shape failure all occurred at the time of wire drawing in a wire manufacturing process and at the time of complex loop control in a wire bonding process, etc., became problems, and the stability or the like of a ball bonding shape was insufficient.

Regarding multilayer wires, in order to comprehensively satisfy various characteristics, such as to realize practical use in a semiconductor manufacturing process where a defective fraction is managed in a ppm order, to accomplish mass-production stability better than that of currently used mono-layer wires like general-purpose gold bonding wires, to stabilize a quality, and to improve a yield in drawing of thin wires and a productivity thereof, the inventors of the present invention focused on hydrogen contained bonding wires, and found that it is effective if the concentration of hydrogen and the distribution thereof are managed highly precisely. Moreover, in order to promote effective control of the hydrogen concentration, the inventors of the present invention also found that the thickness and the structure of an outer layer, addition of an alloy element into the outer layer or a core member, and normalization of a wire manufacturing process, etc., are effective.

According to a semiconductor bonding wire having a core member which is mainly composed of at least one of Cu, Au and Ag, and an outer layer formed on the core member and made of Pd, if the concentration of hydrogen in a whole wire is within a range from 0.0001 to 0.008 mass %, the sphericity of a ball, the surface characteristic thereof become good, and the workability in a wire manufacturing process and the quality originating from delaying of progression of oxidization are improved, so that both productivity and use performance can be improved simultaneously. "The core member mainly composed of at least one of Cu, Au and Ag" corresponds to a core member containing the foregoing elements, and for example, the elements having its/their concentration within a range equal to or larger than 50 mol %. If the core member is Cu, Au or Ag, connection of a wire using a conventional wire bonding apparatus is easy, and a comprehensive reliability is good, so that it can be used as the core member. Preferably, if the core member is Cu, the cost of material is inexpensive, any oxidization by the Pd outer layer can be suppressed, so that at it is most effective. From the standpoint of management of hydrogen concentration, the best effect can be accomplished if the core member is Cu.

Regarding the foregoing range of hydrogen concentration, if hydrogen is contained by equal to or larger than 0.0001 mass %, because of an effect of suppressing any oxidization of Cu at the time of arc discharging, an effect of improving the sphericity of a ball and of suppressing any formation of a shrinkage cavity at a leading end of the ball can be accomplished. If the concentration exceeds 0.008 mass %, air bubbles are produced in a ball, so that the shape of a bonded part becomes unstable, and the bonding strength thereof is reduced. Preferably, if the concentration is within a range from 0.0001 to 0.004 mass %, a ball bonding property is further improved as any formation of a pit-like tiny hole in a side face of a ball is suppressed, and the possibility of breaking of wire at the time of fast-speed wire drawing is reduced, thereby improving the productivity. More preferably, if the concentration is within a range from 0.0001 to 0.002 mass %, any wire breaking defects at the time of fast-speed wire drawing can be suppressed, thereby improving the productivity. If the concentration is within the foregoing ranges, reduction of strength due to peeling of the Pd outer layer and clogging of a wire drawing dice due to cutting scraps are suppressed, resulting in improvement of a wire-drawing speed. As the worn-out of the dice is suppressed and the lifetime of the dice is extended, the quality becomes stable, and the production efficiency is improved. Further preferably, if the concentration is within a range from 0.0001 to 0.001 mass %, in the case of extremely thin wires having a wire diameter of equal to or less than 18 μm which is requisite for accomplishment of a fine diameter, the yield is improved by reducing any wire-breaking defects, and the productivity is further improved by increasing the wire-drawing speed. With respect to a problem in which an opening is clogged in bonding for fine diameter connection and the replacement frequency of a capillary increases, if the concentration is within the foregoing ranges, the replacement lifetime of a capillary is extended, and an effect of improving the production efficiency in a mounting process can be accomplished.

It is verified that the reason why management of hydrogen concentration is effective is bound up with a structure that the core member is coated with a thin Pd film. The use performance of a monolayer wire mainly composed of Cu, Au or Ag is not improved at all even if hydrogen is controlled, but oxidization, sulfuration, and contamination of a wire surface become dominant. Moreover, according to monolayer wires mainly composed of Pd, it is difficult to control a concentration of hydrogen to be a low concentration in mass-production, and even if the concentration of hydrogen is managed, a wire workability, a ball bonding property, etc., are not improved.

A thin Pd outer layer formed on the surface of a bonding wire by plating or the like often has a different behavior from the known physicality of a bulk of Pd. It is thought that the solubility of hydrogen in the Pd thin film and absorption thereof also differ from those of the bulk. In general, it is known that a Pd alloy in a bulk has high hydrogen absorption and can absorb hydrogen equal to or larger than 900 times as much as the volume of Pd. According to the thin Pd outer layer, however, the solubility of hydrogen and an adequate concentration thereof differ from those known in the case of a bulk of Pd alloy. One of the factors is that as the composition of the outer layer, the grain diameter, the lattice defect density, etc., differ from those of a bulk, a hydrogen concentration depends on a manufacturing process of the bonding wires.

When sites where hydrogen is present are classified, such sites can be classified as the Pd outer layer, the proximity of the boundary between the outer layer and the core member, the core member, and the outermost surface of a bonding wire. Mainly, the concentration of hydrogen contained in the Pd outer layer is often highest, some of hydrogen in this site are vaporized when the bonding wire is melted at the time of electrical discharge, and an effect of stabilizing ball formation by the vaporization can be expected. Hydrogen contained in the interface in the vicinity of the boundary between the outer layer and the core member and in a diffusion layer affects the adhesiveness between the outer layer and the core member, which has a major effect to peeling at the time of wire processing and occurrence of any defects like scratches. When the core member is Cu, a tiny amount of hydrogen contained in Cu directly affects the stability at the time of loop formation, and indirectly affects an oxygen content in Cu, bringing about hardening of a ball. Hydrogen adsorbed in the outermost surface of a bonding wire is little, but an effect of stabilizing a loop shape can be expected as the sliding resistance of a wire surface is reduced. Note that the outermost surface means a region having a depth of 2 nm from the surface.

It is desirable that the concentration of hydrogen should be managed in the unit of a total concentration of hydrogen contained in a multilayer wire. That is, it is a total concentration of hydrogen contained in the Pd outer layer, the proximity of the boundary between the outer layer and the core member, the core member, and the wire outermost surface. As explained above, as hydrogen is contained in respective sites, an effect of comprehensively improving the use performance can be accomplished, it is desirable to manage the concentration of hydrogen in the unit of total concentration. Moreover, from the standpoint of analysis of hydrogen concentration, measurement of the total concentration of hydrogen contained in a multilayer wire has a high analysis precision, and is practical.

It is fine if the concentration of hydrogen contained in a multilayer wire is one measured from a bonding wire after a certain period has elapsed since its manufacturing. It is verified that even if a multilayer wire is left in an atmosphere, the concentration of hydrogen contained in the multilayer wire has a little variation with time. In general, bonding wires are stocked in a plastic container called a spool case, and protected from any adhesion of particles from external air. In a normal stock condition in which the bonding wires are retained in the spool case, it is verified that a change in the concentration of hydrogen is little up to a period of about four months in which the bonding wires are left in an atmosphere after manufacturing. Conditions for preparing measurement samples affect the measured concentration of hydrogen, but if, at least a degreasing process of rinsing the samples in acetone with the aid of ultrasound prior to measurement is performed for one minute or so, dried by cold air, weighed and then used for measurement of concentration, hydrogen can be measured with a precision sufficient to the present invention. It is appropriate if the mass of measurement samples necessary for quantification is equal to or larger than 2 g. Accordingly, the concentration of hydrogen in the present invention means that hydrogen contained in bonding wires with a certain mass is measured, and an hydrogen content represented by mass % of hydrogen contained per a total mass is taken as such hydrogen concentration.

There are several techniques for measurement of hydrogen concentration, but in order to precisely detect a tiny amount of hydrogen concentration in a thin wire, it is confirmed that quantitative measurement can be made through dissolution heat conductivity technique. Thermal Desorption Spectrometry (hereinafter, referred to as TDS), etc. It is confirmed that if a result measured through either one of the dissolution heat conductivity technique or TDS is within a range of hydrogen concentration explained in the present invention, the relationship with the use performance can be satisfied. The melting heat conduction technique makes measurement relatively easy, but is likely to be effected by foreign factor like preparation of measurement samples. TDS is a technique of detecting a concentration of gas desorbed from samples while a temperature is being increased, and has an advantage of enabling acquisition of information on existence form or the like of a gas as a gas amount can be identified from a temperature. By a mere analysis of this technique, it is difficult to quantize the concentration of hydrogen, and it is desirable to quantize the concentration of hydrogen using a calibration sample having an analytical concentration known beforehand as a normal sample. For quantization of the hydrogen concentration, measurement was made under the same condition with an in-steel gas analytical management sample JSS GS-1d (hydrogen mass: 1.6 mass ppm) made by Japan Iron and Steel Federation being used as a calibration sample, and a concentration of hydrogen acquired based on an acquired mass spectrum strength was used.

It is desirable that the foregoing bonding wire should be a bonding wire having a ratio of the concentration of hydrogen that is detected within a temperature range from 150 to 500° C. in the TDS and measured at a temperature-rising speed of 1.00 to 300° C./h relative to the total concentration of hydrogen detected in an entire measuring temperature range equal to or larger than 50%. Regarding the entire measuring temperature range, if it is preferably within a range from a room temperature to 900° C., substantially total hydrogen contained in the wire can be detected. When the presence conditions of hydrogen contained in a multilayer wire are broadly divided, such conditions can be classified into diffusive hydrogen and hydroxide. The diffusive hydrogen is hydrogen that can freely diffuse within a metal mainly as an interstitial atom. According to a multilayer wire having the core member of Cu, Au or Ag coated with the Pd outer layer, it is thought that mainly the diffusive hydrogen has a strong correlation with the foregoing use performance. Conversely, the hydroxide is a compound of hydrogen and a metal. Hydroxide becomes a factor of making a wire brittle at the time of wire deformation, and of a crack, and stimulates formation of a ball in an abnormal shape, an that it is desirable to maintain the hydroxide in a little amount. The diffusive hydrogen is desorbed at a relatively low temperature from the sample. When study was made using the multilayer wires each having a wire diameter of 15 to 100 μm as measurement samples, it is confirmed that the diffusive hydrogen can be detected within a temperature range from 150 to 350° C. when measurement is carried out at a temperature-rising speed of 100 to 300° C./h. Conversely, the hydroxide can be detected within a temperature range from 550 to 900° C. If the ratio of the concentration of hydrogen detected within a temperature range of 150 to 500° C. relative to a total concentration of hydrogen detected within an entire measuring temperature range is equal to or larger than 50%, it corresponds to a fact that most hydrogen contained in a bonding wire sample is diffusive hydrogen. If such a ratio is equal to or larger than 50%, effects of causing a ball shape to have a good sphericity and of improving workability at the time of wire manufacturing can be promoted. Preferably, if such a ratio is equal to or larger than 70%, any formation of an abnormal-shape ball is suppressed when a thin wire having a wire diameter of equal to or less than 20 μm is used, and an effect of improving the sphericity is further enhanced. The temperature range for detecting hydrogen depends on a temperature-rising speed, and there is a tendency that the temperature range is shifted to a high-temperature side if the temperature-rising speed becomes fast.

A concentration of hydrogen largely depends on a manufacturing process of multilayer wires. It is confirmed that, in general, multilayer wires right after the Pd outer layer is formed are likely to have a high concentration of hydrogen. When the concentration of hydrogen is excessively high, the outer layer goes brittle in a wire manufacturing process and the adhesiveness with the core member is reduced, resulting in reduction of the manufacturing yield of bonding wires and the quality thereof. Regarding the diffusive hydrogen mainly contained in multilayer wires, it is relatively easy to release such diffusive hydrogen to the exterior of a wire by a heating process. Accordingly, for adjustment of an appropriate concentration of hydrogen, utilization of a heating process is effective. According to the heating process, heating conditions differ depending on a structure of a wire, a material thereof, and processes before and after heating process, and in addition, it is also requisite to comprehensively satisfy bonding performances. For multilayer wires each comprising the Pd outer layer and the core member of Au, Cu or Ag, an appropriate heating condition for adjusting a concentration of hydrogen obviously differs from those of the case of the core member only or of the case of a Pd wire, and for example, heating for a relatively long time at a low temperature is effective. As an example, it is possible to preferentially release excessive hydrogen by heating for 10 minutes to two hours within a temperature range of 150 to 300° C., and stabilize a concentration of hydrogen contained in a whole multilayer wire. In the heating process executed in a normal bonding-wire manufacturing process, because an object is to normalize a mechanical characteristic, and to ensure a linearity by removing any work strains, etc., a temperature is as high as 400 to 700° C., so the wire is generally caused to go through the interior of a heating furnace and a heating time is generally several seconds. In contrast, the heating process for adjustment of the concentration of hydrogen in multilayer wires is executed at a low temperature and for a long time. The specific examples of such heating condition will be discussed later.

Regarding a concentration of hydrogen contained in multilayer wires, it is often effective to separately manage a concentration of hydrogen in the halfway of a manufacturing process and a concentration of hydrogen in a final-product bonding wire. The manufacturing process of multilayer wires has different requisitions from those of the case of monolayer wires. For example, there are lots of problems particular to the multilayer structure, such as the adhesiveness between the outer layer and the core member, and uniformity of the thickness and texture of the outer layer. In order to comprehensively overcome such problems, a gradual decrease technique is effective which sets the concentration of hydrogen to be relatively high at the time of processing and sets the concentration of hydrogen to be a low concentration in a final product. Moreover, if it is attempted to release excessive hydrogen contained in a wire at once, there are concerns that a surface scratch and a wire breaking occur. If the concentration of hydrogen is reduced step by step, such process issues can be eliminated. The foregoing concentration range which is from 0.0001 to 0.008 mass % is a concentration of hydrogen preferable for a final product, and if the concentration of hydrogen of an intermediate product is within a range from 0.0002 to 0.015 mass %, a stable productivity can be obtained. It is peculiar to multilayer wires to manage a concentration of hydrogen based on a reference divided into an appropriate concentration for bonding and an appropriate concentration for a process, and such management is different from the cases of the conventional monolayer wires and metal thin wires for different purposes.

It is desirable that the foregoing outer layer should have a thickness within a range from 0.01 to 0.2 μm. If a multilayer wire having the Pd outer layer covering the surface of the core member of Cu, Au and Ag has a total concentration of hydrogen contained in a whole wire being within a range from 0.0001 to 0.008 mass %, and if such an outer layer has a thickness within a range from 0.01 to 0.2 μm, the concentration of hydrogen can be stabilized within the foregoing concentration ranges, resulting in accomplishment of both good ball shape and workability, and in enhancement of the oxidation resistance of the wire surface. From the standpoint of hydrogen concentration management for improving productivity and a stability of aging variation, it is effective to preferentially control hydrogen contained in the Pd outer layer. As a storage example of bonding wires, it is confirmed that, according to the bonding wire of the present invention, no bonding failure occurs in a wire connecting process even if such a bonding wire is left in an atmosphere at a room temperature for 60 days. This is a remarkable extension of a storage lifetime because the storage lifetime of the conventional monolayer Cu wire is within seven days. If the thickness of the outer layer is equal to or larger than 0.01 μm, it becomes easy to stabilize the concentration of hydrogen, and if the thickness exceeds 0.2 μm, a ball is hardened, and it is anxious that such a hardened ball may damage a chip at the time of bonding. Preferably, if the thickness of the outer layer is within a range from 0.02 to 0.095 μm, in addition to improvement of oxidation resistance, a ball bonding strength can be increased, which is effective for low-temperature bonding, etc.

In the foregoing outer layer, it is desirable that a region having a concentration of Pd relative to a total concentration of metal elements equal to or larger than 80 mol % should have a thickness from 0.003 to 0.08 μm. If a multilayer wire having the Pd outer layer covering the surface of the core member of Cu, Au and Ag has a total concentration of hydrogen contained in a whole wire being within a range from 0.0001 to 0.008 mass %, and if a region (high-concentration Pd layer) having a concentration of Pd relative to a total concentration of metal elements being equal to or larger than 80 mol % has a thickness from 0.003 to 0.08 μm, th distribution of hydrogen can be concentrated in the vicinity of the surface of a bonding wire. This brings about effects of suppressing any oxidization and any brittle behavior of a neck part in the vicinity of a ball and affected by heat, thereby improving a pull strength, and reducing the possibility of the neck part being damaged at the time of low-loop formation. It is confirmed that the high-concentration Pd layer having a concentration of Pd equal to or larger than 80 mol % has a hydrogen thickening effect which distributes a large amount of hydrogen. Even if the total concentration of hydrogen contained in a whole wire is low, as the high-concentration Pd layer is managed, hydrogen at a low concentration can be stably distributed in the vicinity of the wire surface. If the thickness of the high-concentration Pd layer is equal to or thicker than 0.003 μm, it is effective to bring about a hydrogen thickening effect, but if such a thickness exceeds 0.08 μm, the shapes of loops become varying when trapezoidal loops are formed.

It is desirable that a bonding wire should have a diffusion layer having a concentration gradient between the foregoing outer layer and the core member, and the foregoing diffusion layer should have a thickness from 0.003 to 0.015 μm. If a multilayer wire having the Pd outer layer covering the surface of the core member of Cu, Au and Ag has a total concentration of hydrogen contained in a whole wire being within a range from 0.0001 to 0.008 mass % and has the diffusion layer having a concentration gradient, formed between the outer layer and the core member, and having a thickness from 0.003 to 0.015 μm, it is effective to improve the linearity of a loop and to stabilize a loop shape. The diffusion layer is a layer formed by interdiffusion of a metal (Cu, Au and Ag) of the core member and Pd of the outer layer. The diffusion layer is expected to suppress any varying of the strength, the rigidity, and the texture of the core member to homogenize those by controlling movement of hydrogen in a direction from the Pd outer layer to the core member, and to suppress any peeling, spacing, etc., originating from the uneven distribution of hydrogen in the vicinity of an interface by improving the adhesiveness of the interface between the outer layer and the core member. That is, it can be understood that the linearity and the stability of a loop shape are improved as the diffusion layer homogenizes the core member and improves the adhesiveness of the interface between the outer layer and the core member. The reason why the diffusion layer should have a thickness from 0.003 to 0.15 μm is that the foregoing improvement effect is little if the thickness is less than 0.003 μm and a wedge bonding property is deteriorated if the thickness exceeds 0.15 μm. Preferably, if the thickness is from 0.01 to 0.1 μm, a better effect of accomplishing a good linearity in a long span in which a wire length is equal to or longer than 5 mm and of stabilizing a loop shape can be obtained.

FIG. 1 shows an illustrative metal-element concentration profile in a direction from a wire surface to a core member (to the center of a wire diameter) in the foregoing multilayer bonding wire. The wire comprises a core member 1, an outer layer 2, and a diffusion layer), and FIG. 1 shows a concentration profile of a main constituent A of the outer layer and that of a main constituent B of the core member. The diffusion layer 3 is formed between the core member 1 and the outer layer 2.

According to a definition for the diffusion layer in the present invention, from the standpoint of performances, such as an adhesiveness, a strength, a looping property, and a bonding property, of a productivity, etc. the diffusion layer is a region where a detected concentration of Pd is from 10 to 50 mol %. This is because the diffusion layer in such a concentration range can have a low concentration of Pd and have a different role from that of the outer layer and that of the core member. Moreover, a boundary between the outer layer and the core member corresponds to a part where a detected concentration of Pd is equal to or larger than 50 mol %, i.e., the outer layer is a region of a surface from a part where the total detected concentration of Pd is 50 mol %.

In the present specification, regarding concentrations at the outer layer, the diffusion layer, the core member, etc., respectively, a ratio of a total concentration of metal elements forming the outer layer and the core member, which is called concentration ratio, is used, and a concentration value calculated by excluding gas components, such as C, O, N, Cl, and S, non-metal elements, etc., in the vicinity of the surface is used.

Regarding concentration analysis for the outer layer, the diffusion layer, the core member, etc., a technique of analyzing while digging down from the surface of a bonding wire in a depth direction by sputtering or the like, or a line analysis or a point analysis or the like at a wire cross section is effective. The former technique is effective when the outer layer is thin, but takes lots of time for measurement if the outer layer is too thick. The latter cross-sectional analysis is effective when the outer layer is thick, and has an advantage that checking of a concentration distribution at a whole cross section and of reproducibility at several locations is relatively easy, but decreases its precision when the outer layer is thin. It is possible to carry out measurement by obliquely polishing a bonding wire to enlarge the thickness of the diffusion layer. The line analysis is relatively easy at a cross section, but in order to improve the precision of analysis, it is effective to decrease an analysis interval of the line analysis or to carry out the point analysis by narrowing down a target to a region in the vicinity of an interface where observation is desired. To an analytical apparatus used for such concentration analysis, Electron Probe Micro Analysis (EPMA) technique, Energy Dispersive X-ray analysis (EDX) technique, Auger Electron Spectroscopy analysis (AES), Transmission Electron Microscope (TEM) technique, etc., can be applied. In particular, according to AES, because spatial resolution is high, it is effective for concentration analysis for the outermost thin region. Moreover, for inspection or the like of an average composition, it is possible to dissolve a wire from a surface part step by step in an acid or the like, and to obtain a composition of the dissolved part from a concentration contained in a solution.

It is desirable that a bonding wire should have the core member mainly composed of Cu and also containing at least one of Al, Sn, Zn, B and P, and have a total concentration of alloy element in a whole wire being within a range from 0.0001 to 0.05 mol %. According to a multilayer wire which is mainly composed of Cu, has a total concentration of at least one of Al, Sn, Zn, B and P as alloy elements being within a range from 0.0001 to 0.03 mol %, and has the Pd outer layer covering the surface of the core member, as the total concentration of hydrogen contained in a whole wire is within a range from 0.0001 to 0.008 mass %, a leaning characteristic that is a defective mode at the time of high-loop formation can be improved. In the case of multi-tier bonding with multiple pins, there are concerns that a leaning failure of a bonding wire being fallen over in the vicinity of a neck part at the time of forming a loop having a high loop height occurs. When multilayer wires comprising a Cu core member and a Pd outer layer contain hydrogen, there is a tendency that the possibility of such leaning failure increases. Because a neck part is affected by heat of ball melting, recrystallized grains of the core member become rough and hydrogen in the Pd outer layer or the Cu core member diffuses, so that a strength of the interior of a wire and a distribution of a texture or the like become nonuniform, which may cause such leaning failure. Because at least one of Al, Su, Zn, B and P as alloy elements makes the mechanical characteristic of the core member and the texture thereof uniform, the leaning characteristic is improved. If the total concentration of such alloy elements is less than 0.0001 mol %, the improvement effect is little, and if it exceeds 0.05 mol %, a bonding wire is hardened, a peel bonding strength which is a strength evaluation for a wedge bonded part decreases.

It is desirable that a bonding wire should have the foregoing core member which is mainly composed of Cu or Au and which contains at least one of Pd, Ag and Pt as alloy elements, and the concentration of the alloy elements in a whole wire should be within a range from 0.05 to 2 mol %. According to a multilayer wire which is mainly composed of Cu or Au, has a total concentration of at least one of Pd, Ag and Pt as alloy elements in the core member being within a range from 0.01 to 2 mol %, and has the Pd outer layer covering the surface of the core member, as the total concentration of hydrogen contained in a whole wire is within a range from 0.0001 to 0.008 mass %, the reliability of a bonded part between a bonding wire and an aluminum electrode can be improved. For a test of the bonding reliability, a high-temperature and high-humidity test (Pressure Cooker Test: PCT) or the like is effective. According to a PCT, a bonding wire is heated at 130° C. and at 85% RH for 300 to 1000 hours which are typical conditions, and an electrical characteristic or a bonding strength is evaluated. When multilayer wires comprising a Cu or Au core member and a Pd outer layer contain hydrogen, the reliability may decrease through a PCT. The reason why the reliability is improved as at least one of Pd, Ag and Pt as alloy elements is contained in the core member within a range from 0.05 to 2 mol % is that a compound growth speed at a bonded interface at the time of heating is slowed, and a region where the foregoing alloy element is concentrated at the bonded interface functions as a diffusion barrier against hydrogen. If the total concentration of the alloy elements is less than 0.05 mol %, the effect of improving the reliability is little, and if it exceeds 2 mol %, a ball is hardened and a chip may be damaged at the time of bonding. Regarding the concentration analysis of elements contained in the core member, it is preferable to use a value acquired by averaging concentration values obtained at equal to or larger than three locations of a wire cross section through the above-explained analytical techniques, such as EPMA, EDX, and AES.

When the outer layer of a multilayer bonding wire containing hydrogen at the foregoing concentration of hydrogen comprises at least two layers, it is possible to improve various functionalities, such as a bonding property, and a loop shape. Regarding a relationship between the concentration of hydrogen in a multilayer bonding wire and the characteristic feature, the explanation was mainly given of a case in which the outer layer is a single layer, but a hydrogen concentration management is also effective for a multilayer bonding wire comprising at least two layers which are an outer layer and a concentrated layer. Hereinafter, regarding a bonding wire comprising an outer layer and a concentrated layer, an explanation will be separately given on two cases: a case in which the concentrated layer (referred to as a surface concentrated layer) is formed at a wire surface and a case in which the concentrated layer (referred to as an intermediate layer) is formed between the core member and the outer layer.

First, an explanation will be given of the surface concentrated layer. It is desirable that a bonding wire should have the core member mainly composed of Cu, the outer layer formed on the foregoing core member and mainly composed of Pd, and a concentrated layer formed at the surface side of the foregoing outer layer and containing at least either one of Ag and Au, and have a total concentration of hydrogen contained in a whole wire being within a range from 0.0001 to 0.008 mass %. As formation of such concentrated layer (surface concentrated layer) of at least either one of Ag and Au at the surface side of the outer layer and a hydrogen concentration management are combined, it is possible to obtain a good wedge bonding property even from a bonding wire which was stocked for a long time. For example, it is confirmed that a successive bonding property when the foregoing bonding wires stocked for three months are bonded is good and a pull strength (second pull strength) in the vicinity of a wedge bonded part maintains a high value which is equal to or larger than 80% relative to a value prior to storage. The Ag or Au surface concentrated layer is expected to suppress any entrance of gas components, such as hydrogen and oxygen, from a wire surface, so that the concentration of hydrogen can be held at substantially constant even if a wire is stocked for a long time, thereby maintaining a good metal diffusion at the time of wedge bonding. The foregoing surface concentrated layer is included in a part of the outer layer. This is because the surface concentrated layer and the outer layer have lots of common functions, and as explained above, the outer layer is defined as a region from a part where the concentration of Pd is equal to or larger than 50 mol % to a surface.

Figure 2:
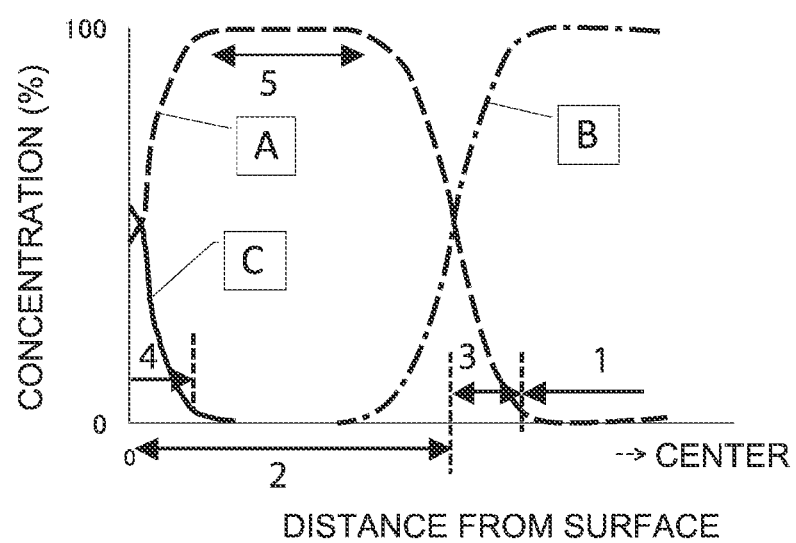
FIG. 2 is a diagram showing a concentration profile of a bonding wire having an outer layer with a surface concentrated layer, and a core member.

FIG. 2 shows an illustrative metal-element concentration profile in a direction from a wire surface to a core member (to the center of a wire diameter) in a bonding wire having an outer layer including the above-explained surface concentrated layer. A surface concentrated layer 4 containing a main constituent C which comprises at least either one of Ag and Au is present on the surface of an outer layer 2, and a single-metal layer 5 to be discussed later is formed inside the outer layer 2.

As an element to be concentrated is at least either one of Ag and Au, a wedge bonding property is highly improved in comparison with cases of other elements. In particular, as an example in which such an improvement effect is remarkable, it is confirmed that a good effect of improving a wedge bonding property in mounting of a QFN (Quad Flat Non-lead) structure where a low bonding property is a problem can be obtained. In the QFN mounting, because fixing of a lead part is insufficient, bonding of a bonding wire with ultrasound vibration being weakened is requisite. QFN mounting is difficult when the outer layer of a multilayer bonding wire is Pd which is hard, but in contrast, a successive connectivity is improved by forming an Ag or Au concentrated layer, at the surface side of the outer layer, enabling improvement of productivity in QFN mounting.

In bonding wires having a concentrated layer of at least either one of Ag and Au formed at the surface side of the outer layer mainly composed of Pd, the foregoing hydrogen concentration management becomes more important than the case of the outer layer having no concentrated layer. This is because the foregoing concentrated layer has an effect of suppressing a any releasing of hydrogen to the exterior of a wire so that a concentration of hydrogen contained in a wire in a manufacturing process increases and a problem such as deterioration of ball formation originating from hydrogen as explained above is likely to occur. Moreover, because Cu itself can contain a tiny amount of hydrogen, when the core member is mainly composed of Cu, it is effective to consider a relationship between formation of the concentrated layer and hydrogen concentration management.

It is desirable that the foregoing surface concentrated layer should be made of a solid solution alloy of Pd and at least either one of Ag and Au. It is defined that a region of the surface concentrated layer is a region having a concentration of Ag or Au equal to or larger than 10 mol % and has a higher concentration than those of surroundings. This is because if a region is highly concentrated at equal to or larger than 10 mol % locally, it is possible to control a diffusion behavior at a bonded part and bending of a wire at the time of loop formation, etc. It is verified that such effect of stabilizing loop shape has a higher tendency in the concentrated layer than in the single-metal region. Preferably, if the foregoing concentrated layer is not an intermetallic compound but a solid solution alloy, a loop shape can be stabilized even if a bending angle is large like the case of short span.

It is desirable that the surface concentrated layer should have a concentration gradient of at least either one of Ag and Au. The concentration gradient makes a second pull strength in wedge bonding enhanced, so that a yield at the time of actual mounting further improves. Such an improvement effect is effective in both cases of BGA and CSP, but in particular, an effect of increasing a second pull strength becomes higher in wedge bonding in QFN mounting. It is expected that because the surface concentrated layer has a concentration gradient, in comparison with an alloy having substantially constant concentration, an effect of promoting large plastic deformation of a wire required for wedge bonding and interdiffusion at a bonding interface is high. When inclination of a concentration gradient in a wire diameter direction is equal to or larger than 10 mol % per 1 μm, an effect of increasing a second pull strength in QFN mounting is further enhanced. Preferably, if such inclination is equal to or larger than 30 mol % per 1 μm, it is confirmed that an effect of increasing a second pull strength in QFN mounting is high because interdiffusion at a bonding interface is promoted.

It is desirable that the Pd concentration in the outermost surface of the surface concentrated layer should be within a range from 20 to 90 mol %. Accordingly, an effect of reducing any variation in a loop shape in the case of long span and of improving a bonding property of a thin wire is accelerated. When a wire surface is all covered by Pd, a failure (Wrinkled Loop) becomes a problem which produces stair-like wrinkles at the time of loop formation under condition of long span that is equal to or longer than 4 mm. This is because a friction between Pd, which is hard, and an internal wall of a capillary increases and slidability becomes poor. The reason why the concentration of Pd at the outermost surface is less than 90 mol %, i.e., a total concentration of Ag and Au is equal to or larger than 10 mol % is that loop control is improved in the case of long span, and in particular, the above-explained Wrinkled Loop failure is effectively improved. Moreover, as the total concentration of Ag and Au in the outermost surface of the concentrated layer is set to be equal to or larger than 10 mol %, a wedge bonding property can be improved even in the case of thin wire having a wire diameter of 20 μm. Conversely, when the concentration of Pd is less than 20 mol %, i.e., when the total concentration of Ag and Au is equal to or larger than 80 mol %, a non-melted part is left inside a ball, so that a shear strength of a ball bonded part is reduced. Preferably, as the concentration of Pd is within a range from 30 to 80 mol %, a better effect of suppressing any Wrinkled Loop failure in the case of extremely thin wire having a wire diameter of equal to or smaller than 18 μm can be accomplished.

It is desirable that a Pd single-metal layer should be present inside the outer layer with the surface concentrated layer. That is, it is desirable that a semiconductor bonding wire should have the core member mainly composed of Cu, the outer layer formed on the core member and mainly composed of Pd, have a total concentration of hydrogen contained in a whole wire being within orange from 0.0001 to 0.008 mass %, have the concentrated layer of at least either one of Ag and Au at the surface side of the outer layer, and have the Pd single-metal layer inside the outer layer. Accordingly, ball bonding with a good sphericity and with little size variability is enabled. The Pd single-metal layer is, in consideration of restriction like an error in concentration measurement, a region having a concentration of Pd equal to or larger than 97%. It is desirable that the location of the Pd single-metal layer should be adjacent to the concentrated layer. For example, in a wire structure from a wire surface toward the interior of a wire, such a structure is exemplified as the Ag or Au concentrated layer, the Pd single-metal layer, the Pd—Cu diffusion layer, and the core member in this order.

A role of the Pd single-metal layer is a barrier function of suppressing any diffusion of Cu of the core member in a surface direction. The barrier function brings about effects of suppressing any segregation of Cu at a surface and any oxidization, and as a result, arc discharging is stabilized, thereby enabling ball formation with a good sphericity. As the outer layer utilizes the synergetic effect brought by the Ag or Au concentrated layer at a surface, the Pd single-metal layer inside the outer layer, and a hydrogen concentration management, even under a severe condition in which a tiny ball is bonded using a thin wire, the sphericity of a ball bonded part and the stability of sizes can be improved. In particular, an improvement effect of accomplishing a good sphericity in the case of a large ball deformation where the diameter of a ball to be bonded is three times as much as a wire diameter is remarkable. The Pd single-metal layer alone is insufficient and for example, it is effective that the Ag or Au concentrated layer at a surface maintains a wedge bonding property of a wire stocked for a long time, which also stabilizes arc discharging and stabilizes a large ball deformation. It is desirable that the Pd single-metal layer should have a thickness within a range from 0.005 to 0.1 μm. If the thickness is equal to or thicker than 0.005 μm, the foregoing effect can be obtained sufficiently, and if it exceeds 0.1 μm, melting of Pd which is a high-melting metal becomes unstable at the time of ball formation, and a ball bonded shape like a petal becomes a problem.

It is desirable that the thickness of the outer layer with the surface concentrated layer should be within a range from 0.02 to 0.4 μm. Accordingly, in addition to improvement of a wedge bonding property and a second pull strength after a long-term storage, a productivity and a second pull strength in QFN mounting all of which are the effects of the outer layer with the surface concentrated layer, it is also possible to simultaneously improve a ball bonding property, which is the effect of the outer layer with a managed concentration of hydrogen. If the thickness of the outer layer is equal to or thicker than 0.02 μm, accomplishment of the foregoing effects is facilitated, and if such a thickness exceeds 0.4 μm, a ball is hardened and it is of a concern that a chip may be damaged at the time of bonding. Preferably, if the thickness of the outer layer is within a range from 0.03 to 0.3 μm, a second pull strength at low temperature in QFN mounting can be increased. More preferably, if it is within a range from 0.04 to 0.25 μm, a higher effect of improving a ball bonding strength and a second pull strength at the time of low-temperature bonding in QFN mounting can be obtained.

Next, an explanation will be given of an intermediate layer. It is desirable that a bonding wire should have the core member mainly composed of Cu, the outer layer formed on the core member and mainly composed of Pd, and an intermediate layer between the core member and the outer layer and composed of at least either one of Ag and Au, and have a total concentration of hydrogen contained in a whole wire being within a range from 0.0001 to 0.008 mass %. As formation of the intermediate layer between the core member and the outer layer of at least either one of Ag and Au is combined together with a hydrogen concentration management, a ball bonding property when a bonding wire stocked for a long time is used is improved. For example, it is confirmed that, in the case of a ball bonded part where the foregoing bonding wire stocked for four months is used, formation of internal air bubbles in a ball is suppressed, and an initial shear strength and a bonding reliability under a high-humidity environment are improved. This is because of, as a role of the internal concentrated layer, the barrier function of suppressing any intrusion of hydrogen, oxygen, etc., in an internal direction, of preventing hydrogen in Cu from being a solid solution substance, and of suppressing any diffusion of Cu atoms in the core member in a surface direction, formation of air bubbles when a ball is cured due to hydrogen, oxygen, etc., is suppressed.

As the element concentrated in the intermediate layer is at least one of Ag and Au, a bonding property at a ball or at a bump can be improved in comparison with other elements. As a specific example in which such an improvement effect is remarkable, it is confirmed that a wedge bonding property on a bump in reverse bonding mounting is improved. It is a problem that the surface of a bump is oxidized while being left for a while on a heating stage after the bump is formed, so that a wedge bonding property on a bump is deteriorated in comparison with normal bonding schemes. The intermediate layer has an effect of reducing formation of a Cu oxide film on a bump surface, so that the yield of successive bonding and the productivity thereof in reverse bonding mounting are improved. Note that reverse bonding is to bond a ball on a lead electrode and to perform wedge bonding on a bump.

Regarding an interface of the intermediate layer, such an interface is defined as a region having a total concentration of the concentrated element being equal to or larger than 20 mol % at the outer layer side and at the core member side. This is because a necessary concentration to effectively develop the foregoing barrier function requisite for the intermediate layer is equal to or larger than 20 mol %.

It is desirable that the intermediate layer should have a concentration gradient of at least either one of Ag and Au. The concentration gradient in the concentrated layer improves a leaning characteristic in reverse bonding mounting. A leaning failure is a phenomenon that a wire falls over at an upstanding part in the vicinity of a ball bonded part, and because the length of the upstanding part is longer than those of normal mounting schemes in reverse bonding mounting, a leaning failure is likely to occur. One of the reasons of such failure is that nonuniform recrystallized textures are formed due to an effect of heat to the upstanding part at the time of ball formation. Conversely, as the intermediate layer has a concentration gradient, in comparison with a case in which a concentration is substantially constant, the recrystallized texture and residual strain of the upstanding part affected by heat are uniform, so that it is expected that an effect of suppressing any leaning failure in reverse bonding mounting is obtained. If the average inclination of the concentration gradient is equal to or larger than 20 mol % per 1 μm, the foregoing effect can be obtained. Preferably, if it is equal to or larger than 60 mol % per 1 μm, an effect of suppressing any leaning failure can be improved.

It is desirable that the maximum total concentration of Ag and Au in the intermediate layer should be within a range from 30 to 90 mol %. Accordingly, an appropriate parameter window in wedge bonding on a bump extends, so that it becomes possible to carry out bonding within a range with a low load and a low ultrasound output, thereby improving the bonding yield in reverse bonding. Ultrasound vibration of wedge bonding on a bump with a further complex shape can be reduced, so that it becomes possible to suppress any bending of a wire. This is because an effect of promoting a large plastic deformation requisite for wedge bonding and interdiffusion at a bonding interface is high as the intermediate layer has a concentration gradient in comparison with the concentrated layer having a substantially constant concentration. If the maximum concentration of Ag and Au is equal to or larger than 30 mol %, the foregoing improvement effect can be obtained, and if it is equal to or larger than 90 mol %, a non-melted portion remains inside a ball, so that a shear strength of a ball bonded part decreases.

Figure 3A:
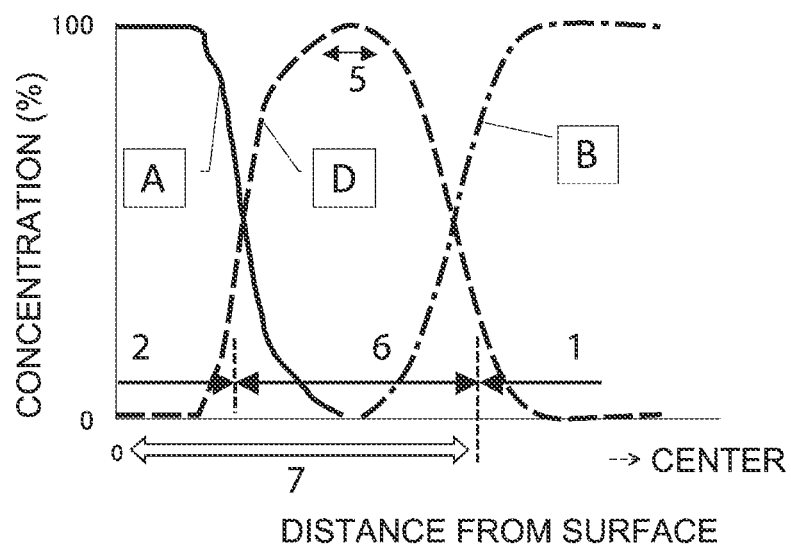
FIG. 3A is a diagram showing a concentration profile of a bonding wire having an outer layer, an intermediate layer, a core member, and having a single-metal layer.
Figure 3B:
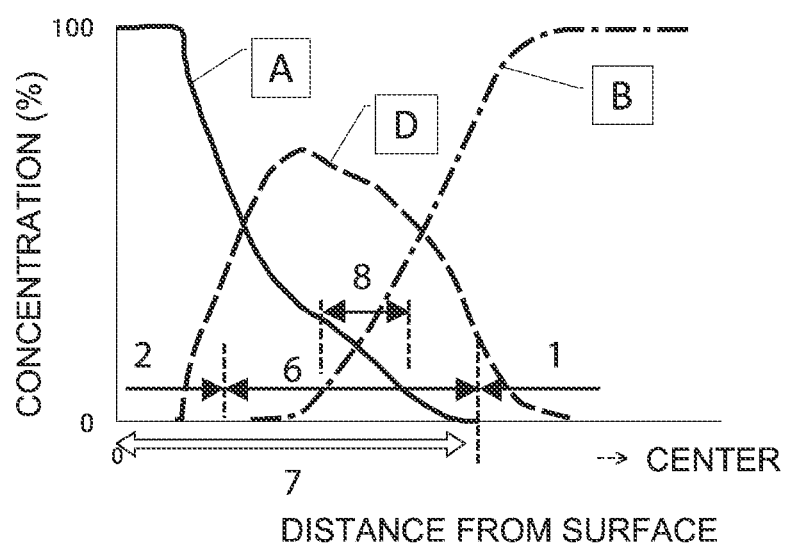
FIG. 3B is a diagram showing a concentration profile of a bonding wire having an outer layer, an intermediate layer, and a core member and having a concentration gradient in which at least three elements are mixed.

It is desirable that the location of the intermediate layer should be between the outer layer and the core member. This location improves the barrier function of suppressing any interdiffusion of hydrogen and Cu. FIG. 3 shows an illustrative metal-element concentration profile in a direction from a wire surface to a core member (to the center of a wire diameter) in a bonding: wire having an outer layer with an intermediate layer. Formed between an outer layer 2 and a core member 1 is an intermediate layer 6 mainly composed of a material D which comprises at least either one of Ag and Au. FIG. 3A is for a case in which a single-metal layer 5 is present in the intermediate layer 6, and FIG. 3B is for a case in which a concentration gradient region 8 where at least three elements are mixed is present in the intermediate layer 6.

According to the bonding wire structure, the outer layer, the intermediate layer, and the core member are present in this order, and the intermediate layer is formed instead of a Pd—Cu diffusion layer that is a diffusion layer of the core member and the outer layer. A requisite element to be concentrated is at least either one of Ag and Au, and other elements are at least either one of Pd and Cu. Illustrative intermediate layers when Au is concentrated are classified into following three kinds: (1) a concentration gradient of Pd and Au, (2) a concentration gradient of Au and Cu, and (3) a concentration gradient of three elements which are Au, Pd and Cu. It is desirable that the foregoing concentration gradient should be a solid solution alloy formed by interdiffusion. The structure of the intermediate layer has at least one of (1) to (3). For example, if the intermediate layer is constituted by plural combinations: (1)+(2), (1)+(3), and (1)+(2)+(3), the foregoing barrier effect is further improved, and a high effect of improving the productivity of reverse bonding is obtained. The same is true of the case in which the concentrated element is Ag.

That is, it is desirable that the foregoing intermediate layer should have a coexistence region of at least either one of Ag and Au and a concentration gradient of at least three elements including Pd and Cu. Accordingly, a fast pull strength in the vicinity of a ball especially in reverse bonding can be enhanced. An example of the coexistence region of the concentration gradient of three elements is (3), and as recrystallization of a part which is affected by heat and which is present in the vicinity of a ball is suppressed, a fast pull strength is increased.

It is desirable that a thickness which is a total of the outer layer and the intermediate layer should be within a range from 0.02 to 0.5 µm. If the thickness is equal to or thicker than 0.02 µm, the foregoing effect of improving a successive bonding property in reverse bonding is easily obtained, and if the thickness is equal to or thicker than 0.5 µm, a ball is hardened and it is of a concern that a chip may be damaged at the time of bonding. In FIG. 3 that exemplifies a concentration profile when the outer layer 2 has the intermediate layer 6, a total thickness of the outer layer 2 and the intermediate layer 6 is indicated by an arrow 7. Preferably, if the thickness is within a range from 0.07 to 0.4 µm, a ball bonding strength and a second pull strength in a low-temperature bonding condition in reverse bonding can be enhanced. More preferably, if the thickness is within a range from 0.13 to 0.3 nm, in an overhang type reverse bonding in which any chip damage is feared at the time of bonding, a high effect of increasing a wedge bonding strength on a bump can be obtained.

Regarding a total thickness of the outer layer and the intermediate layer and that of the core member, between a boundary where total concentration of Ag and Au is 20 mol % or a boundary where a concentration of Pd is 50 mol %, one which is closer to the wire center is selected as a boundary. When the maximum concentration of Ag and Au is low, most part of the intermediate layer is included in the outer layer. It is difficult to set a boundary between the outer layer and the intermediate layer from the standpoint of its function, and to completely separate from each other. Instead, it is verified that a total thickness of the outer layer and the intermediate layer is an advantageous barometer for a correlation with a bonding performance.

As explained above, regarding a region where Ag, Au is concentrated, two examples, the surface concentrated layer in the vicinity of a wire surface and the intermediate layer between the core member and the outer layer were explained. In both cases of the surface concentrated layer and the intermediate layer, there are lots of common features such that the main component of the core member and the outer layer is Cu and Pd respectively, and the concentrated element is at least either one of Ag and Au. The inclusion concentration of those elements in a whole wire affects a ball bonding property, a bonding reliability, etc.

That is, it is desirable that a semiconductor bonding wire should have at least either the surface concentrated layer and the intermediate layer, the outer layer, and the core member, and have a total concentration of Pd, Ag and Au being within a range from 0.4 to 4 mol %. If such a concentration is within this range, an effect of simultaneously accomplishing a good sphericity of a ball bonded part, improvement of a shear strength, and reduction of Al splash can be obtained under a fine diameter connection of 50 µm. Al splash is a phenomenon that Al are blasted out around the outer circumferential part of a ball bonded part when a hard ball is bonded on an Al electrode. Because Al blasted out by Al splash becomes a cause of electrical short-circuiting failure when contacting adjoining bonded part, fine diameter connection is disturbed. As Pd, Ag and Au contained in the outer layer, the concentrated layer, and the intermediate layer of a wire become solid solution substances in Cu at the time of ball curing so that a Cu—Pd—Au alloy and a Pd—Ag—Cu alloy are formed, and as Pd, Ag and Au promote diffusion at a bonding interface, an advantageous effect of improving a ball bonding property is obtained. It is confirmed that formation of such particular alloys, and promotion of diffusion are much promoted in the multilayer bonding wires of the present invention having the surface concentrated layer and the intermediate layer rather than bonding wires with a monolayer structure, if the foregoing concentration is equal to or larger than 0.4 mol %, the foregoing effect is easily obtained, and if it exceeds 4 mol %, a ball is hardened and there are concerns that a chip may be damaged at the time of bonding. Preferably, if the foregoing concentration is within a range from 0.5 to 3 mol %, effects of reducing Al splash and of increasing a low-temperature bonding strength under a fine diameter connection of 40 µm are enhanced. More preferably, if the foregoing concentration is within a range from 0.7 to 2.7 mol %, a higher effect of improving a productivity under a fine diameter connection of 40 µm is further obtained.

It is desirable that the foregoing total concentration of Pd, Ag and Au should be within a range from 0.4 to 4 mol %, and a ratio R indicating the total concentration of Ag and Au relative to a concentration of Pd should be within a range from 0.001 to 0.4. As a concentration ratio R represented as (Ag+Au)/Pd is within the foregoing range, an effect of improving a high-temperature bonding reliability for next-generation in-vehicle ICs. The high-temperature bonding reliability corresponds to suppression of any deterioration of a bonding strength in heating at, for example, 185° C. which is a higher temperature than that in existing acceleration tests for 1500 hours. Regarding a correlation with a bonding reliability, in addition to the foregoing respective thicknesses of the outer layer, the concentrated layer, and the intermediate layer, the inventors of the present invention found that a correlation with the concentration ratio R represented as (Ag+Au)/Pd is more important and is effective and convenient. This is because Pd, Ag and Au become solid solution substances in Cu by melting and solidification at the time of ball formation, the concentration itself is dominant for a bonding reliability of a ball, and thicknesses of respective layers vary depending on the definition for a layer interface.

The detail of a mechanism that concentration ratio R represented as (Ag+Au)/Pd is effective has not been completely clarified yet. At the current moment, a possibility is thought that Ag+Au and Pd mutually affect to interdiffusion at a bonded part or brittleness originating from growth of a particular intermetallic compound like ternary system affects. In the cases of Ag and Au, an interdiffusion speed with Al of a bonded part and a growth speed of an Ag—Al based or Au—Al based intermetallic compound are fast in comparison with the case of Pd, so that diffusion of Pd is delayed when a total concentration of Ag and Au is high. Moreover, it is thought that because a void is produced by formation of a particular intermetallic compound, such as an Ag—Pd—Al based intermetallic compound or an Au—Pd—Al based intermetallic compound, a bonding strength is reduced.

If the concentration ratio R represented as (Ag+Au)/Pd is within an appropriate range which is from 0.001 to 0.4, an effect of improving a high-temperature bonding reliability is obtained. Mass-production of multilayer bonding wires having a fairly thin Ag, Au concentrated layer where R is less than 0.001 is difficult, and there are concerns that the high-temperature bonding reliability is reduced if R exceeds 0.4. Preferably, if R is within a range from 0.002 to 0.3, establishment of a mass-production technology of forming the surface concentrated layer or an internal concentrated layer is facilitated, and a bonding reliability is improved which is good at 185° C. for up to 2000 hours. More preferably, if R is within a range from 0.01 to 0.25, a productivity is improved due to simplification of a manufacturing process of bonding wires, and a bonding reliability is further improved which is good at 185° C. for up to 2500 hours.

Requisites in manufacturing the bonding wires of the present invention are a step of forming the outer layer on the surface of the core member, and the surface concentrated layer or the intermediate layer, and a processing/heating step of controlling respective structures of the outer layer, the surface concentrated layer, the intermediate layer, the diffusion layer, and the core member. In order to control respective compositions and respective thicknesses of the outer layer, the surface concentrated layer, the intermediate layer, and the core member, in the foregoing step of forming the outer layer, the surface concentrated layer, and the intermediate layer, it is primarily important to manage a thickness and a composition at an initial stage of forming the outer layer, the surface concentrated layer, and the intermediate layer.

Examples of a technique of forming the outer layer, the surface concentrated layer, and the intermediate layer on the surface of the core member are plating, vapor deposition, etc. Regarding plating, manufacturing is enabled through both electrolytic plating and nonelectrolytic plating. In the case of electrolytic plating, a so-called strike plating or flash plating, a plating speed is fast and an adhesiveness with an underlayer is good. Solutions used for nonelectrolytic plating are classified into a substitutive type and a reduction type, and when a film to be formed is thin, merely substitutive type plating is sufficient, but when a film to be formed is thick, it is effective to perform reduction type plating step by step after substitutive type plating. Nonelectrolytic plating uses simple apparatuses or the like, but needs more time than electrolytic plating.

In a step of forming a film through plating, hydrogen produced in a plating solution or the plating solution may remain in the outer layer, and as a result, a concentration of hydrogen initially contained in a multilayer wire may be high. In electrolytic plating, because hydrogen is likely to be produced in the vicinity of the surface of a bonding wire, such hydrogen is likely to be trapped in the outer layer. Moreover, in electrolytic plating, it is possible to stably control the concentration or the like of diffusive hydrogen initially introduced in the outer layer, so that if conditions at a manufacturing step, such as processing, heating, etc., after film formation are made appropriate, it is relatively easy to control a concentration of hydrogen contained in a final product.

In vapor deposition, physical adsorption, such as sputtering, ion plating, or vacuum deposition, and chemical adsorption like plasma CVD can be used. As all techniques are dry type, no rinsing after film formation is requisite, and it is not necessary to concern about any surface contamination at the time of rinsing.

For a stage where plating or deposition is performed, a technique of forming a film with a target wire diameter and a technique of forming a film on a core member with a large wire diameter and of drawing a wire several times up to a target wire diameter are both effective. In the case of the former film formation at a final wire diameter, manufacturing, quality management, etc., are simple, and in the case of a combination with the latter film formation and wire drawing, it is effective to improve an adhesiveness between the film and the core member. Specific examples of respective formation techniques are a technique of successively sweeping a wire in an electrolytic plating solution to form a film with a core member having a target wire diameter being used, or a technique of dipping a thick core member in an electrolytic or nonelectrolytic plating solution and of drawing a wire to obtain a final wire diameter.

For formation of the surface concentrated layer and the intermediate layer, a technique of successively forming the outer layer and the surface concentrated layer or the intermediate layer, and a technique of forming the outer layer, of processing a wire, and of forming the surface concentrated layer or the intermediate layer can be used. An in-line successive plating can be exemplified as a step of plating the outer layer, a step of rinsing, and a step of plating the surface concentrated layer. A formation order is reversed between the surface concentrated layer and the intermediate layer. In the case of the surface concentrated layer, the order becomes as follows: formation of the outer layer, and formation of the surface concentrated layer. In the case of the intermediate layer, the order becomes as follows: formation of the intermediate layer, and formation of the outer layer. It is not necessary that a formation step of the outer layer and a formation step of the surface concentrated layer are continuous, and a heating step, a wire drawing step, etc., for improvement of an adhesiveness and management of a hydrogen gas concentration can be added. In the formation of the surface concentrated layer or the intermediate layer, it is effective to utilize diffusion at a heating step. In the heating step to be discussed later, it is possible to form desired surface concentrated layer, intermediate layer and a concentration gradient thereinside, but if necessary, selection of a heating condition appropriate for form a ion of the surface concentrated layer or the intermediate layer becomes requisite.

In the processing step after the outer layer, the surface concentrated layer or the intermediate layer are formed, mill rolling, swaging, dice wire drawing, etc., are selected and performed depending on a purpose. As a process speed, a pressurization ratio, a dice surface reduction ratio, etc., indirectly affect a processed composition, transposition, imperfection of crystal grain boundary, etc., it is possible to change the concentration and distribution of hydrogen contained in a wire. A concentration of hydrogen also affects the structure and adhesiveness of the outer layer.

The heating step is one of processes effective to control a concentration of hydrogen. However, as other purposes of heating, elimination of a work strain, control of a recrystallized composition, adjustment of a mechanical characteristic, control of the surface concentrated layer or the intermediate layer, and formation of the diffusion layer have also important roles. As it is difficult to satisfy all of those functions through one-time heating, it is productive if heating is performed separately in several times. If a wire is just heated, comprehensive development of the foregoing functions is difficult. When work-strain elimination annealing carried out only once at a final wire diameter in normal wire manufacturing is just applied as it is, it is difficult to make a concentration of hydrogen appropriate and to improve a quality and a manufacturing yield. This is because in the halfway of rolling or drawing a multilayer wire containing excessive hydrogen, an adhesiveness between the outer layer and the core member is reduced and the outer layer is peeled, a wire surface is scratched, and a yield is reduced due to a wire-breaking failure. Hence, it is important to control a timing, a temperature, a speed, a time, etc., of heating.

In particular, in the case of multilayer wires comprising the Pd outer layer and the Au, Cu, Ag core member, or the Pd outer layer, the Au or Ag surface concentrated layer or intermediate layer, and the Cu core member, low-temperature heating is effective as heating for adjustment of a concentration of hydrogen. Even at a low temperature, as diffusive hydrogen contained excessively is repelled from a wire, it becomes adequately possible to make a total concentration of hydrogen contained in a whole multilayer wire appropriate. As a basis of this fact, the inventors of the present invention figured out from their study that diffusive hydrogen among several hydrogen forms contained in the foregoing multilayer wire most affects a use performance. It is desirable to adjust a time with a temperature being within a range from 100 to 400° C. as a recommended condition for adjustment of the concentration of diffusive hydrogen. It is desirable that a heating time should be relatively long. Heating for a long time is effective to diffuse hydrogen contained in a wire to a surface thereof, and has little action to a composition, a strength, and elongation, etc. of a bonding wire, so that it is advantageous to facilitate management of other processes. As a heating technique, batch-type heating using a heating furnace is convenient. Such batch-type heating is hardly carried out in the conventional monolayer wire manufacturing process. General work-strain elimination annealing for bonding wires is successive annealing of heating a wire while successively moving the wire at a high temperature which is from 300 to 700° C. For this reason, it is clear that a temperature, a time, a scheme of heating for the purpose of adjustment of concentration of hydrogen differ from those of normal heating. In a heating atmosphere, it is effective to heat a wire while allowing an inactive gas, such as $N_2$ or Ar, to flow in the furnace. Accordingly, it becomes possible to suppress any oxidization of a wire surface. Moreover, vacuum heating is also effective, and it is possible to promote repelling of hydrogen by adjusting a vacuum degree to be equal to or less than 0.1 MPa. As a timing of heating, annealing right after the outer layer and the surface concentrated layer or the intermediate layer are formed is desirable. By eliminating excessive diffusive hydrogen, improvement of the productivity of wire drawing work is facilitated. Furthermore, it is effective to adjust a concentration of hydrogen step by step through several-times heating.

It is difficult to satisfy all requisite characteristics of a bonding wire by merely the foregoing low-temperature heating mainly for the purpose of adjustment of a hydrogen concentration. Heating for the purpose of control of a recrystallized composition, adjustment of a mechanical characteristic, control of the texture of the surface concentrated layer, and formation of the diffusion layer, etc., is also necessary. As features of this heating, it is requisite that a temperature must be higher than the recrystallization temperature of a wire, and the temperature must homogenous in a circumference direction in order to form the uniform intermediate layer and diffusion layer between the outer layer and the core member. Successive annealing of performing heating while successively sweeping a wire is productive. A wire is moved and heated in a furnace having a temperature set to be from 250 to 700° C. at a speed of 10 to 400 m/min. A homogeneous heating technique of making the temperature in the furnace homogeneous or a heating technique of making a temperature gradient in the furnace can be selected. According to the latter technique, for example, a technique of introducing a local temperature gradient and a technique of changing the temperature in the furnace are effective. As a wire is heated while an inactive gas, such as $N_2$ or Ar, is allowed to flow in the furnace, it is possible to suppress any oxidization of a wire surface. A timing of high-temperature heating can be divided into annealing during working and finish annealing at a final wire diameter, and those can be selected and applied. One-time or several-times heating is possible. As heating is divided into several times, formation of the diffusion layer, elimination of a work strain, etc., can be individually accomplished, and it is effective to improve the performance of a bonding wire.

As processing and heating are combined to control the progress level of diffusion, it is possible to control a layer thickness, a texture, and a structure to a desired level. A work history prior to heating relates to a composition or the like at respective interfaces of the outer layer, the surface concentrated layer, the intermediate layer, and the core member, and also affects a diffusion behavior in heating. Depending on in which work stage heating is executed, respective composition, respective thicknesses, etc., of the final outer layer, surface concentrated layer, intermediate layer, and diffusion layer change. As an example, according to a bonding wire which was manufactured from steps of performing intermediate annealing while being processed, of drawing the wire, and of performing finish annealing at a final wire diameter, in comparison with a step without intermediate annealing, it is confirmed that respective compositions and respective concentration gradients of the outer layer, the diffusion layer, the surface concentrated layer, and the intermediate layer change.

In the case of multilayer bonding wires with a core member mainly composed of Cu, it is confirmed that a good ball bonding property can be accomplished when a shield gas which is used at the time of forming a ball in a bonding process is a pure $N_2$ gas or 5 vol % $H_2+N_2$ gas. According to this bonding technique, by using an inexpensive pure $N_2$ gas instead of 5 vol % $H_2+N_2$ gas which is a standard gas, a running cost can be reduced, thereby promoting practical use of multilayer wires.

EXAMPLES

Next, an explanation will be given of examples of the present invention.

As raw materials of a bonding wire, Cu, Au or Ag which was a highly pure material having a purity of equal to or larger than about 99.99 mass % was used for a core member, and Pd for an outer layer and Au or Ag which was a material for a surface concentrated layer or an intermediate layer having a purity of equal to or larger than 99.9 mass % were prepared. In a step of melting the core member, an appropriate amount of alloy element was added.

A thin wire thinned to a certain wire diameter was used as the core member, and the Pd outer layer and the surface concentrated layer or the intermediate layer of at least either one of Au and Ag were formed on the wire surface by electrolytic plating, nonelectrolyte plating, or vapor deposition. A technique of forming the outer layer at a final wire diameter and a technique of forming the outer layer, the surface concentrated layer or the intermediate layer with a certain wire diameter, and of thinning the wire to a final wire diameter by drawing were applied. For an electrolytic plating solution and a nonelectrolytic plating solution, plating solutions commercially available for a semiconductor purpose were used, and sputtering was applied as vapor deposition. Regarding an order of film formation, an order of formation of the outer layer and of formation of the surface concentrated layer, and an order of formation of the intermediate layer and of formation of the outer layer were adopted. As needed, a heating step, a wire drawing step, etc., were added between formation of the outer layer and formation of the surface concentrated layer or the intermediate layer. Bonding wires each having a diameter of from 0.023 to 5 mm or so were prepared beforehand, respective wire surfaces were coated by vapor deposition, plating, etc., the wires were drawn to a final wire diameter which was from 18 to 30 µm, and eventually, a work strain was eliminated and heating was applied so that an elongation rate became within a range from 5 to 20%. The wire drawing speed was within a range from 5 to 200 m/min. As needed, wires were subjected to dice wire drawing to a wire diameter of 30 to 100 µm, and diffusion heating was applied, and a wire drawing work was further performed.

Wire heating of the present invention is classified into two schemes: batch-type annealing of inserting a thick wire in a heating furnace to heat the wire, and successive annealing of successively heating a thin wire while the wire is successively swept, and either one of heating schemes or both heating schemes were utilized. The batch-type annealing had a main purpose of adjustment of a concentration of hydrogen and of formation of a diffusion layer, and heating was performed for 10 minutes to two hours within a temperature range from 150 to 300° C. The successive annealing was set to be in a temperature range from 300 to 700° C., and a wire sweeping speed was set to be within a range from 10 to 500 mm/min. Together with a temperature distribution, the wire sweeping speed or the like was made appropriate. For both schemes, in order to suppress any oxidization, an inactive gas, such as $N_2$ or Ar, was used as an atmosphere of heating. A gas flow amount was adjusted within a range from 0.0002 to 0.004 $m^3$/min, and was also utilized for temperature control in a furnace. A timing of performing heating was classified into three kinds: primary annealing right after a plating layer was formed, intermediate annealing during a wire drawing work, and finish annealing at a final wire diameter, and those heating steps were combined appropriately. In the primary annealing, wires with a wire diameter of 0.5 to 6 mm were annealed in a batch scheme, in the intermediate annealing, wires with a wire diameter of 0.06 to 1 mm were annealed in a successive manner, and in the finish annealing, and wires with a final wire diameter were annealed in a successive manner.

For measurement of a hydrogen concentration, two schemes: an inactive gas dissolution heat conductivity technique and TDS were utilized. Regarding measurement apparatuses used, RH402 made by LECO was used for the former inactive gas dissolution heat conductivity technique, and M-100-QA-M or M-201-QA-TDM which was a quadrupole mass spectrometer made by ANELVA was used for the latter TDS. When a concentration of hydrogen was analyzed with diffusive hydrogen and hydride being separated from each other, the latter apparatus was mainly used. Regarding heating of samples, a temperature was risen from 0 to 900° C. at a speed of 200° C./h, and an amount of discharged hydrogen was measured per temperature. It is defined that a concentration of hydrogen detected at a temperature from 150 to 500° C. corresponds to the concentration of diffusive hydrogen, and a concentration of hydrogen detected at a temperature from 100 to 900° C. is a total concentration of hydrogen. A rate of the concentration of hydrogen detected at a temperature from 150 to 500° C. relative to a total concentration of hydrogen was obtained. An exhaust speed of a vacuum pump in the measurement apparatus was set to be 2400 to 300 liter/min (in $N_2$ gas conversion).

Depth analysis through an AES was utilized for measurement of a layer thickness of a wire surface, and surface analysis and point analysis through an AES, an EPMA, etc., were carried out for observation of an element distribution like concentration at a crystal grain boundary. In depth analysis through an AES, a wire was sputtered by Ar ions to perform measurement in a depth direction, and a unit of depth is indicated in an $SiO_2$ conversion. A concentration of alloy element in a bonding wire was measured through an ICP analysis or the like. Regarding the concentration analysis of the element contained in the core member, an average value of concentrations acquired at equal to or greater than five locations in a cross section in a lengthwise direction passing through a wire center through an EPMA, an EDX, and an AES was used.

Regarding respective concentration gradients of the surface concentrated layer and the intermediate layer, if an average of the inclination of a concentration gradient was equal to or larger than 30 mol % per 1 µm, it is indicated by a symbol A in fields "concentration gradient of surface concentrated layer" and "concentration gradient of intermediate layer" in table 3, if such an average was equal to or larger than 1.0 mol % and less than 30 mol %, it is indicated by a symbol B, and if such an average was less than 10 mol %, it is indicated by a symbol C.

For connection of bonding wires, a commercially available automatic wire bonder was used to perform ball/wedge bonding. A ball was formed at a leading end of a wire by arc discharging, was bonded on an electrode film on a silicon substrate, and another end of the wire was subjected to wedge bonding on a lead terminal. For a shield gas used for suppressing any oxidization at the time of ball formation, a typical 5 vol % $H_2+N_2$ gas and a pure $N_2$ gas were used. A pure $N_2$ gas having a purity of equal to or greater than 5N was basically used except for evaluation of a ball shape. A gas flow amount was adjusted within a range from 0.0003 to 0.005 $m^3$/min.

Al alloy films (an Al-1 mass % Si-0.5 mass % Cu film, and Al-0.5 mass % Cu film) having a thickness of 1 µm which were materials of an electrode film on a silicon substrate were used as objects to be bonded with a bonding wire. Conversely, as an object subjected to wedge bonding, a lead frame having an Ag plating (thickness: 1 to 4 μm) formed on the surface thereof or a resin substrate with an electrode structure of Au plating/Ni plating/Cu was used.

Regarding the workability of a bonding wire, the number of wire breakage in a step of drawing the wire from a thick wire with a wire diameter of 500 μm to a thin wire with a wire diameter of 22 μm or 18 μm was evaluated. Regarding a sample length, a wire of 5000 m was drawn at a time that a wire diameter was 500 μm. For strict failure acceleration evaluation, a wire was drawn at a fast speed twice as much as a normal wire drawing speed. When the number of wire breakage was zero, a remarkably high productivity was expected so that it is indicated by a double circular mark in a field "wire drawing workability" in table 2. When the number of wire breakage was one or two, it was determined that a productivity was good, which is indicated by a circular mark. When the number of wire breakage was within a range from three to six, a slight change in a wire drawing condition was necessary, no that it is indicated by a triangular mark. When the number of wire breakage was equal to or greater than seven, there were concerns about deterioration of a productivity, so that it is indicated by a cross mark.

For observation of an initial ball shape, twenty balls having a normal size within a range where a ratio of ball diameter/wire diameter was from 1.8 to 2.3 times were picked up, and observed through an optical microscope or an SEM, and evaluation was made for three characteristics: sphericity, misalignment, and ball surface. In evaluation of sphericity, when the number of produced balls in an abnormal shape was equal to or greater than four, it vas a failure, which is indicated in a field "sphericity" in table 2 by a cross mark. When the number of abnormal-shaped balls was one to three and when the number of noticeable misalignment of a ball position relative to a bonding wire was equal to or greater than three, it is indicated by a triangular mark. When the number of abnormal-shaped balls was one to three and when the number of misalignment was one to three, it was determined that there is no substantial problem in practical use, which is indicated by a circular mark. When a total number of misalignment and abnormal shape was equal to or less than one, ball formation was good, so that it is indicated by a double circular mark.

For observation of a side face of an initial ball, thirty balls were observed through an SEM, and when the number of balls having a tiny opening, concavity and convexity, pit, etc., equal to or larger than 5 μm was equal to or greater than five at the side face, it was a failure, which is indicated by a cross mark in a field "bubble in side face of ball" in table 2. When the number of balls having rough concavity and convexity was one to four and when the number of balls having tiny concavity and convexity like a bubble equal to or less than 5 μm was equal to or greater than five, it is indicated by a triangular mark in the table. When there was no rough concavity and convexity but when the number of balls having tiny concavity and convexity was within a range from two to four, it was determined that there was no problem in practical use, which is indicated by a circular mark in the table. When the number of balls having tiny concavity and convexity was equal to or less than one, a ball surface was in a good shape, so that it is indicated by a double circular mark in the table.

For evaluation of a bonded shape of a compressively bonded ball, 200 bonded balls were observed, and evaluation was made for a sphericity of a shape, an abnormal deformation failure, and a size precision, etc. Two kinds of bonding wires having a wire diameter of 23 μm and a wire diameter of 18 μm were used. A ball in a normal size that a ratio of initial ball diameter/wire diameter as 1.8 to 2.3 was formed for evaluation. When the number of ball shape failures, such as anisotropy off-centered from a true circle defective and petal-like deformation was equal to or greater than five, it was determined as a failure, which is indicated by across mark in afield "compressive bonded shape" in table 2. When the number of defective ball shapes out of true circle was two to four, this case was divided into two groups: when the number of abnormal deformation occurred was equal to or greater than one, improvement was desirable in mass-production, which is indicated by a triangular mark in the table, and when no abnormal deformation occurred, it was OK to use, which is indicated by a circular mark in the table. When the number of defective ball shape was equal to or less than one, it was good and it is indicated by a double circular mark in the table.

Regarding large ball deformation, with a wire diameter being 20 μm, among balls having a large size that a ratio of initial ball diameter/wire diameter was 3.0 to 3.5, an evaluation of a bonded shape of compressively bonded balls was made based on the foregoing determination criteria, and the results were shown in a field "large ball deformation characteristic" in table 4.

For evaluation of a ball bonding strength, samples bonded at a stage temperature of 175° C. so that a ball diameter became within a range from 45 to 60 μm at a wire diameter of 23 μm were used. Two kinds of wires, one was a bonding wire having a period of 30 days from its manufacturing to bonding, and another was a bonding wire having such a period of 120 days, were used. Twenty balls were subjected to a shear test, and an average of shear strengths was measured, and a shear strength per unit area calculated by using an average value of respective areas of ball bonded parts was used. When a shear strength per unit area was less than 70 MPa, a bonding strength was insufficient, which is indicated by a cross mark in a field "shear strength" in table 2. When a shear strength was within a range from equal to or larger than 70 MPa and less than 90 MPa, improvement of shear strength was possible by slight change in a bonding condition, and it is indicated by a triangular mark in the table. When a shear strength was within a range from equal to or larger than 90 MPa and less than 110 MPa, there was no problem in practical use, and it is indicated by a circular mark in the table. When a shear strength was equal to or larger than 110 it was good and it is indicated by a double circular mark in the table.

For evaluation of a damage to a chip, a ball was bonded on an electrode film, the electrode film was etched and eliminated, and any damage to an insulation film or a silicon chip was observed through an SEM. The number of electrodes observed was 400 When no damage was observed, it is indicated by a double circular mark in a field "chip damage" in table 2. When the number of cracks less than 5 μm was equal to or less than two, it was determined as no problem, which is indicated by a circular mark in the table. When the number of cracks equal to or larger than 5 μm and less than 20 μm was equal to or greater than two, it was determined as an anxious level, which is indicated by a triangular mark in the table. When the number of cracks equal to or larger than 20 μm or a cratered damage, etc., was equal to or greater than one, it was determined as an anxious level which is indicated by a cross mark in the table.

A wedge bonding property was evaluated based on the number of non-stick failures when a bonding wire was bonded on a lead electrode. Two kinds of bonding wires, one was in an initial condition in which storage after its manufacturing was within seven days, and another was in a condition in which it was left for 60 days in an ambient atmosphere at a room temperature, were used. Bonding wires were stocked in a clean room while being retained in a spool case. Regarding a bonding condition, an ultrasound output was slightly reduced to induce non-sticking. A stage temperature was set to be 160° C. which was a low temperature for accelerating a failure in the case of the boding wires in an initial condition, and to be 175° C. for the case of the bonding wires left for 60 days. 2000 bonding wires were evaluated for the occurrence frequency of non-stick failure. When the number of non-stick failures was equal to or greater than six, an improvement was requisite, so that it is indicated by a cross mark in a field "wedge bonding property" in table 2. When the number of non-stick failures was from three to five, it is indicated by a triangular mark in the table. When the number of non-stick failures was one or two, it was substantially good, and it is indicated by a circular mark in the table. When the number of non-stick failures was zero, it was determined that a wire storage lifetime was good, which is indicated by a double circular mark in the table.

In order to evaluate a linearity of a loop having undergone bonding, bonding was carried out at two kinds of wire interval (span): a normal span of 2 mm, and a long span of 5 mm. A wire diameter was set to be 23 μm. Thirty bonding wires were observed through a projector from above, and misalignment of a portion where a bonding wire was most distant relative to a straight line interconnecting a ball side and a wedge side was measured as a bending level. When an average of bending levels was less than one wire with either one of the foregoing wire diameters, it was determined as good, which is indicated by a double circular mark in a field "loop linearity" of table 2. When an average of bending levels was equal to or larger than two wires, it was a failure, which is indicated by a triangular mark in the table. When an average of bending levels was between one and two wires, this was normally no problem, and it is indicated by a circular mark in the table.

For a loop shape stability in a bonding step, a trapezoidal loop was formed at two kinds of wire length: a general-purpose span of 2 mm and a short span of 0.5 mm, and 500 bonding wires for each kind were observed through a projector, and a linearity of a bonding wire, and dispersion in loop heights, etc., were checked. For formation of a trapezoidal loop at a short wire length of 0.5 mm, in order to avoid any contact with a chip end, stricter loop control was requisite. In the case of the wire length of 2 mm, when the number of wires having defects in linearity, loop height, etc., was equal to or greater than five, it was determined as a problem, which is indicated by a cross mark in a field "loop stability" in table 2. When the number of defects at the wire length of 2 mm was from two to four and when the number of defects at the wire length of 0.5 mm was equal to or larger than five, it was determined that improvement was requisite, which is indicated by a triangular mark in the table. When the number of defects at the wire length of 2 mm was equal to or less than one, and when the number of defects at a wire length of 2 mm was from two to four, a loop shape was relatively good, so that it is indicated by a circular mark in the table. When the number of defects at a wire length of 0.5 mm was equal to or less than one, it was determined that a loop shape was stable, which is indicated by a double circular mark in the table. One of the reasons of defects may be insufficiency of adhesiveness at an interface between the core member and an outer circumference part and varying in characteristics at a cross section.

For evaluation of a pull strength, pull test was carried out using samples with a general-purpose span which had a wire length of 2 mm. A first pull test in which a hook was positioned in the vicinity of a ball bonded part and pulled upwardly was carried out. It was confirmed that a neck part was broken and cut. Because a first pull strength depends on a wire diameter of a bonding wire, a loop shape, a bonding condition, etc., a relative ratio (Rf) of first pull strength/wire tensile strength instead of an absolute value was used. When a value of Rf was equal to or larger than 60%, it was excellent, which is indicated by a double circular mark in a field "pull strength" in table 2. When Rf was equal to or larger than 50% and less than 60%, it was good, which is indicated by a circular mark in the table. When Rf was equal to or larger than 40 and less than 50%, it was generally no problem but the sample needed to be treated with care after bonding in some cases, which is indicated by a triangular mark in the table. When Rf was less than 40% a neck strength was insufficient, and an improvement was requisite, which is indicated by a cross mark in the table.

For evaluation of a peel bonding strength, a pull test for a wedge bonded part was carried out. A wire diameter was set to be 23 μm, and a span was set to be 2 mm. A second pull test was carried out in which a hook hooking a loop at a position closer to a wedge bonded part than ¾ of a wire length was moved upwardly, and a breakage strength of a bonding wire was measured. Because a second pull strength depends on a wire diameter of a bonding wire, a loop shape, a bonding condition, etc., a relative ratio (Rp) of second pull strength/wire tensile strength instead of an absolute value was used. When Rp was equal to or larger than 20%, a wedge bonding property was good, which is indicated by a double circular mark in a field "peel bonding strength" in table 2. When Rp was equal to or larger than 15% and less than 20%, it was determined as no problem, which is indicated by a circular mark in the table. When Rp was equal to or larger than 10% and less than 15%, it was determined that a failure would occur, which is indicated by a triangular mark in the table. When Rp was less than 10%, there was a problem in mass-production, which is indicated by a cross mark in the table.

Regarding a leaning failure (leaning characteristic) which is a phenomenon that a wire upstanding part in the vicinity of a ball bonded part falls on, a wire upstanding part was observed in a direction in which a chip was horizontal, and a leaning failure was evaluated based on a maximum gap (leaning: gap) between a vertical line passing through the center of a ball bonded part and a wire upstanding part. A wire length was set to be 3 mm, and the number of samples was set to be 50. For leaning evaluation, samples each having a maximum loop height of about 400 μm which was a strict high loop were prepared. When the leaning gap was smaller than a wire diameter, it was determined that leaning was good, and when the leaning gap was larger than that, the upstanding part inclined, so that it was determined that leaning was poor. Classification was made based on the occurrence frequency of leaning failure, when the number of wires having such failures was equal to or greater than three, it is indicated, by a triangular mark in a field "leaning characteristic" in table 2. When the number of wires having such failures was zero, it is indicated by a double circular mark in the table. When the number of wires having such failures was therebetween, it is indicated by a circular mark in the table.

In PCT (Pressure Cooker Test), wires were heated for 500 hours under a high-temperature and high-humidity environment at 130° C. with a humidity of 85%. Thereafter, electrical characteristics of 40 bonding wires were evaluated. When the percentage of bonding wires having an electrical resistance increased to equal to or larger than three times as much as its initial electrical resistance was equal to or larger than 30%, it was a bonding failure, which is indicated by a cross mark in a field, "PCT reliability" in table 2. When the percentage of bonding wires having an electrical resistance increased to equal to or larger than three times was equal to or larger than 5 and less than 30%, such bonding wires could be used for an IC having no strict requisition for a reliability, and it is indicated by a triangular mark in the table. When the percentage of bonding wires having an electrical resistance increased to equal to or larger than three times was less than 5% and when the percentage of bonding wires having an electrical resistance increased to equal to or larger than 1.5 times was equal to or larger than 5% and less than 30%, there was no problem in practical use, so that it is indicated, by a circular mark in the table. When the percentage of bonding wires having an electrical resistance increased to equal to or larger than 1.5 times was less than 5%, it was good and it is indicated by a double circular mark in the table.

For evaluation of a connection through reverse bonding, a ball was bonded on an electrode film on a silicon substrate to form a bump, the ball was subjected to ball bonding on a lead electrode, a loop shape was controlled, and another end of a wire was subjected to wedge bonding on the bump. Two kinds of chip for evaluation were used: a mono chip type which was a general single-stage chip, and an over-hang type which was a two-stage stacked layer chip having a space below the chip. A chip height was set to be 200 μm. For evaluation of a successive bonding property, 2000 of wires each having a wire diameter of 20 μm were connected, and evaluation was made for the number of non-stick failures of wedge bonding on a bump. For the purpose of acceleration evaluation, a load and an ultrasound vibration were set to be slightly lower than those in a mass-production condition for evaluation of non-stick failure. When the number of non-stick failures was equal to or larger than six, bonding was insufficient, and it is indicated by a cross mark in a field "reverse bonding", "successive bonding property" in table 4. When the number of non-stick failures was three to five, it is indicated by a triangular mark in the table. When the number of on-stick failures was one to two, a practicality could be accomplished by making a bonding condition appropriate, which is indicated by a circular mark in the table. When the number of peeling was zero, a sufficient bonding strength was accomplished, which is indicated by a double circular mark in the table.

For evaluation of a second pull strength in the case of reverse bonding, a hook at a position closer to a wedge bonded part than ¾ of a wire length was moved upwardly, and a breaking strength of a wire was measured. For a second pull strength, a relative ratio (Rp) of second pull strength/wire tensile strength was utilized. When Rp was equal to or larger than 20%, a wedge bonding property was good, which is indicated by a double circular mark in a field "reverse bonding", "second pull strength" in table 3. When Rp was equal to or larger than 15% and less than 20%, it was determined as a no problem, which is indicated by a circular mark it the table. When Rp was equal to or larger than 10 and less than 15%, it was determined that any defects would occur in some cases, which is indicated by a triangular mark in the table. When Rp was less than 10%, there was a problem in a mass-production step, so that it is indicated by a cross mark in the table.

For evaluation of a first pull strength in the case of reverse bonding connection, samples each having a wire diameter of 20 μm and a wire length of 3 mm were subjected to reverse bonding, and 40 samples were subjected to measurement of a pull strength that a portion of each sample was pulled upwardly in the vicinity of a ball bonded part. The foregoing relative ratio (Rf) of first pull strength/wire tensile strength was utilized. When the value of Rf was equal to or larger than 60%, it was excellent and it is indicated by a double circular mark in a field "reverse bonding", "first pull strength" in table 4. When Rf was within a range from equal to or larger than 50% and less than 60%, it was good, and it is indicated by a circular mark in the table. When Rf was equal to or larger than 40% and less than 50%, there was normally no problem but samples after bonding needed to be treated with care in some cases, which is indicated by a triangular mark in the table. When Rf was less than 40%, a neck strength was insufficient and an improvement was requisite, which is indicated by a cross mark in the table.

Regarding a leaning characteristic in the case of reverse bonding connection, a wire upstanding part was observed in a direction in which a chip was horizontal, and evaluation was made based on a maximum gap (leaning gap) between a vertical line passing through the center of a ball bonded part and a wire upstanding part. A wire length was set to be 3 mm, and the number of samples was 300. It was determined that when the leaning gap was smaller than the wire diameter, leaning was good, and when the leaning gap was larger than the wire diameter, an upstanding part inclined, so that leaning was poor. It is classified into the occurrence frequency of leaning failure, and when the number of failures was equal to or larger than seven, it is indicated by a cross mark in a field "reverse bonding", "leaning characteristic" in table 4. When the number of failures was four to six, it is indicated by a triangular mark in the table. When the number of failures was one to three, it is indicated by a circular mark in the table. When the number of failures was zero, it is indicated by a double circular mark.

For a loop stability in the case of a long span, 40 trapezoidal loops were connected at a long span which had a wire length of 5 mm so that a loop height became 200 to 250 μmm and evaluation was made based on a standard deviation in heights. Evaluation was also made for two kinds of wire diameters: 20 μm and 18 μm. For measurement of a height, an optical microscope was used, and measurement was made at two locations: in the vicinity of the highest vertex of a loop, and at the center of the loop. When the standard deviation in loop heights was equal to or larger than ½ of the wire diameter, it was determined that a varying in heights was large, and when the standard deviation was less than ½, it was determined that a varying in heights was small and good. Based on this criteria, when a varying was small at two locations, it was determined that a loop shape was stable, which is indicated by a double circular mark in a field "Wrinkled Loop failure by long span" in table 4. When the number of locations where a varying was lame was one, it was relatively good and it is indicated by a circular mark in the table. When the number of locations was two, it is indicated by a triangular mark in the table. When a varying was large at both two locutions, it is indicated by a cross mark in the table.

Regarding an aluminum splash phenomenon in the case of fine diameter connection, evaluation was made based on a level how much aluminum were blasted out around a ball bonded par in a direction in which ultrasound was applied. Each 200 samples having undergone fine diameter connection of 50 μm at a wire diameter of 20 μm and having undergone fine diameter connection of 40 μm at a wire diameter of 18 μm were used. When the number of wires that the level of aluminum splash was noticeable was equal to or larger than three, an improvement was requisite, which is indicated by a cross mark in a field "Al splash in fine diameter connection" in table 4. When the number of wires with noticeable aluminum blast-out was equal to or less than two and when the number of wires with moderate aluminum blast-out was equal to or greater than six, it is indicated by a triangular mark in the table. When the number of wires with moderate aluminum blast-out was two to five, it is indicated by a circular mark in the table. When the number of wires with moderate aluminum blast-out was equal to or less than one, it was good and it is indicated by a double circular mark in the table.

For evaluation of QFN mounting, 2000 wires were subjected to successive bonding on an 80-pin QFN substrate, and evaluation was made based on the number of non-stick failures. For the purpose of acceleration evaluation, a load and an ultrasound vibration were set to be slightly lower than those in a mass-production condition for evaluation of non-stick failure. When the number of non-stick failures was equal to or larger than six, bonding was insufficient, and it is indicated by a cross mark in a field "QFN mounting", "successive bonding property" in table 4. When the number of non-stick failures was three to five, it is indicated by a triangular mark in the table. When the number of non-stick failures was one to two, a practicality could be accomplished by making a bonding condition appropriate, which is indicated by a circular mark in the table. When the number of peeling was zero, a sufficient bonding strength was accomplished, which is indicated by a double circular mark in the table.

For evaluation of a second pull strength in the case of QFN mounting, a hook hooking a loop at a location closer to a wedge bonded part than ¾ of a wire length was moved upwardly, and a breaking strength of a wire was measured. A relative ratio (Rp) of pull strength/wire tensile strength was utilized. A wire diameter was set to be 20 μm, and a wire length was set to be 3 mm. When Rp was equal to or larger than 40%, a wedge bonding property was good, which is indicated by a double circular mark in a field "QFN mounting", "second pull strength" in table 4. When Rp was equal to or larger than 30% and less than 40%, it was determined as no problem, which is indicated by a circular mark in the table. When Rp was equal to or larger than 25% and less than 30%, it was determined that any defects would occur in some cases, and it is indicated by a triangular mark in the table. When Rp was less than 25%, there was a problem in a mass-production step, which is indicated by a cross mark in the table.

Regarding a high-temperature reliability of a bonded part, samples encapsulated by a resin after bonding were heated at a temperature of 185° C. for 1500, 2000, and 2500 hours, respectively, and electrical characteristics of each 60 bonding wires were evaluated. When the percentage of bonding wires having an electrical resistance increased to equal to or larger than three times as much as its initial electrical resistance was equal to or larger than 30%, it was a bonding failure, which is indicated by a cross mark in a field "high-temperature reliability" in table 4. When the percentage of bonding wires having an electrical resistance increased to equal to or larger than three times was equal to or larger than 5% and less than 30%, such bonding wires could be used for all IC having no strict requisition for a reliability, and it is indicated by a triangular mark in the table. When the percentage of bonding wires having an electrical resistance increased to equal to or larger than three times was less than 5% and when the percentage of bonding wires having an electrical resistance increased to equal to or larger than 1.5 times was equal to or larger than 10% and less than 30%, there was no problem in practical use, so that it is indicated by a circular mark in the table. When the percentage of bonding wires having an electrical resistance increased to equal to or larger than 1.5 times was less than 10%, it was good and it is indicated by a double circular mark in the table.

Tables 1 to 4 show evaluation results of semiconductor devices to which bonding wires of the present invention were connected and comparative examples.

A bonding wire set forth in claim 1 corresponds to examples 1 to 21, and 51 to 72. A bonding wire set forth in claim 2 corresponds to examples 1 to 10, 14 to 16, 18 to 20, 51 to 57, 60 to 67, and 69 to 72. A bonding wire set forth in claim 3 corresponds to examples 1 to 21, and 51 to 72. A bonding wire set forth in claim 4 corresponds to examples 1 to 4, 6 to 9, 11 to 17, 19, 20, 51 to 58, 60 to 67, and 69 to 72. A bonding wire set forth in claim 5 corresponds to examples 1 to 14, 16, 17, 19 to 21, 51 to 56, 61 to 67, and 69 to 71. A bonding wire set forth in claim 6 corresponds to examples 2 to 12, 14, 16, 17, 20, and 21. A bonding wire set forth in claim 7 corresponds to examples 1 to 11, 13, 14, 16 to 20, 71, and 72. A bonding wire set forth in claim 8 corresponds to examples 4, 8, 10, 16, and 18. A bonding wire set forth in claim 9 corresponds to examples 2, 5, 6, 11, and 13. Comparative examples 1 to 7 are results which do not satisfy a condition in claim 1.

A bonding wire set forth in claim 10 corresponds to examples 51 to 60. A bonding wire set forth in claim 11 corresponds to examples 51 to 60. A bonding wire set forth in claim 12 corresponds to examples 52 to 58, and 60, A bonding wire set forth in claim 13 corresponds to examples 51 to 57, and 60. A bonding wire set forth in claim 14 corresponds to examples 51 to 58, and 60. A bonding wire set forth in claim 15 corresponds to examples 61 to 70. A bonding wire set forth in claim 16 corresponds to examples 61 to 70. A bonding wire set forth in claim 17 corresponds to examples 62, 63, 65 to 67, 69, and 70. A bonding wire set forth in claim 18 corresponds to examples 61, 63, and 68. A bonding wire set forth in claim 19 corresponds to examples 62 to 70. A bonding wire set forth in claim 20 corresponds to examples 51 to 54, 56 to 64, and 66 to 70. A bonding wire set forth in claim 21 corresponds to examples 52 to 60, 62 to 64, and 66 to 70. Comparative examples 51 to 56 are results which do not satisfy a condition in claim 1.

Some of evaluation results for representative examples of individual claims will now be explained.

The multilayer wires of examples 1 to 21 and 50 to 72 each comprised a core member mainly composed of at least one of Cu, Au and Ag, and an outer layer formed on the surface of the core member and mainly composed of Pd, and as a total concentration of hydrogen contained in a whole wire was within a range from 0.0001 to 0.008 mass % according to the present invention, it was confirmed that both characteristics, such that the sphericity of a ball is good and a wire workability is good with little wire breakage at the time of wire drawing, were satisfied simultaneously. In contrast, according to comparative examples 1, 51, 54 each having a concentration of hydrogen less than 0.0001 mass % and comparative examples 2 to 4, 52, and 55 each having a concentration of hydrogen exceeding 0.008 mass %, it was difficult to satisfy both a ball shape and a wire workability simultaneously. Moreover, it was confirmed that, according to comparative example 5 having an Au outer layer, comparative example 53 having a Pt outer layer, comparative example 56 having an Ni outer layer, comparative example 6 having a Pt core member, and a monolayer copper wire without an outer layer, a wire workability was insufficient.

It was confirmed that, according to examples 1 to 10, 14 to 16, 18 to 20, 51 to 57, 60 to 67, and 69 to 72 which were preferable examples each having a concentration of hydrogen being within a range from 0.0001 to 0.004 mass %, an effect of suppressing any formation of a tiny hole at a ball side face was high. More preferably, it was confirmed that, according to examples 1 to 8, 14 to 16, 19, 20, 51 to 55, 60 to 65, and 69 to 72 each having a concentration of hydrogen being within a range from 0.0001 to 0.002 mass %, a workability of an extremely thin wire with a wire diameter of 23 μm was improved, and according to examples 1 to 6, 14, 19, 51 to 54, 61 to 64, and 71 each having a concentration of hydrogen being within orange from 0.0001 to 0.001 mass %, a high effect of improving a workability of a further extremely thin wire with a wire diameter of 18 μm was confirmed.

Regarding the multilayer wires of examples 1 to 4, 6 to 9, 11 to 17, 19, 20, 51 to 58, 60 to 67, 69 to 72, as a ratio of a concentration of hydrogen detected within a temperature range from 150 to 500° C. relative to a total concentration of hydrogen detected within a total temperature range was equal to or larger than 50% through TDS measured at a temperature rising speed of 100 to 300° C./h according to the present invention, it was confirmed that a sphericity of a compressively bonded ball shape in the case of a bonding wire with a wire diameter of 23 μm was improved. Preferably, according to examples 2 to 4, 6, 7, 9, 11, 15, 16, 19, 52 to 54, 56, 60, 62 to 65, and 69 to 72 having the foregoing ratio equal to or lamer than 70%, a high effect of improving a sphericity of a compressively bonded ball shape in the case of a bonding wire with a wire diameter of 18 μm was confirmed.

According to the multilayer wires of examples 1 to 14, 16, 17, 19 to 21, and 71, as the thickness of the outer layer was within a range from 0.01 to 0.2 μm according to the present invention, it was confirmed that a wedge bonding property after a bonding wire was left in an atmosphere for 60 days was enhanced. In contrast, according to example 18 with the outer layer having a thickness exceeding 0.2 μm, a chip damage happened. Preferably, according to examples 2, 4 to 7, 9, 10, 14, 16, 19, 20, 71, and 72 each having the outer layer with a thickness being within a range from 0.02 to 0.095 μm, it was confirmed that a shear strength at a ball bonded part was enhanced.

According to the multilayer wires of examples 2 to 12, 14, 16, 17, 20, and 21, as a region where a concentration of Pd was 80 mol % in the outer layer had a thickness within a range from 0.003 to 0.08 μm according to the present invention, an effect of enhancing a pull strength was confirmed. In contrast, according to examples 13 and 18 having the foregoing thickness exceeding 0.08 μm, it was confirmed that a loop stability was reduced.

According to the multilayer wires of examples 1 to 11, 13, 14, 16 to 20, as such wires had the diffusion layer with a concentration gradient between the outer layer and the core member and the diffusion layer had a thickness from 0.003 to 0.15 μm according to the present invention, a loop linearity at a normal wire length which was 2 mm was improved. In contrast, according to examples 12, 21 having the diffusion layer with a thickness exceeding 0.15 μM, it was confirmed that a wedge bonding proper, was decreased. Preferably, according to examples 2 to 9, 11, 14, 16, 17, 19, and 20 having the diffusion layer with a thickness from 0.01 to 0.09 μm, a high effect of further improving a loop linearity in the case of a long span at a wire length which was 5 mm and which needed a strict control was confirmed.

According to the multilayer wires of examples 2, 5, 6, 11, and 13, as such wires had the core member mainly composed of Cu and containing at least one of Al, Sn, Zn, B and P, and the total concentration of alloy-element in a whole wire was within a range from 0.0001 to 0.05 mol % according to the present invention, it was confirmed that a leaning characteristic was improved, in contrast, according to example 14 having the foregoing concentration exceeding 0.05 mol %, it was confirmed that a peel bonding strength was decreased.

According to the multilayer wires of examples 4, 8, 10, 16 and 18, as such wires had the core member mainly composed of Cu or Au, and containing at least one of Pd, Ag and Pt, and the total concentration of alloy-element in the core member was within a range from 0 to 2 mol % according to the present invention, it was confirmed that a PCT reliability was improved. In contrast, according to example 21 having the foregoing concentration exceeding 2 mol %, it was confirmed that a problem that the occurrence frequency of chip damage increased.

According to the multilayer wires of examples 51 to 60, as such wires had the core member mainly composed of Cu, the outer layer formed on the core member and mainly composed of Pd, and the concentrated layer formed at the surface side of the outer layer and containing at least either one of Ag and Au, and a total concentration of hydrogen contained in a whole wire was within orange from 0.0001 to 0.008 mass % according to the present invention, it was confirmed that a second bonding property of a wire left for 90 days was good and a successive bonding property in the case of QFN mounting was good. In contrast, according to comparative examples 51, 52 having the concentrated layer but having a concentration of hydrogen out of the foregoing range, comparative example 53 having the Rh concentrated layer, and examples 61 to 72 having a concentration of hydrogen being within the foregoing range but having no concentrated layer, it was confirmed that the foregoing improvement effect was insufficient.

According to the multilayer wires of examples 51 to 60, as the concentrated layer had a concentration gradient of at least one of Ag and Au according to the present invention, it was confirmed that a second pull strength in the case of QFN mounting was good.

According to the multilayer wires of examples 52 to 58 and 60, as the concentration of Pd at the outermost surface of the concentrated layer was within a range from 20 to 90 mol % according to the present invention, it was confirmed that any Wrinkled Loop failure related to a loop shape in the case of a long span was suppressed. In contrast, according to examples 51 and 59 having the concentration of Pd at the outermost surface being less than 20 mol % or exceeding 90 mol %, no Wrinkled Loop failure was improved. Preferably, according to examples 53 to 58 having the concentration of Pd within a range from 30 to 80 mol %, a high effect of further improving a Wrinkled Loop failure was confirmed.

According to the multilayer wires of examples 51 to 57 and 60, as the Pd single-metal layer was formed in the outer layer with the concentrated layer at the outermost surface thereof according to the present invention, it was confirmed that a large ball deformation characteristic became stable. In contrast, according to examples 58, 59, because no single-metal layer was present in the outer layer, it was confirmed that a deformation shape of a large ball was unstable.

According to the multilayer wires of examples 51 to 58 and 60, as the thickness of the outer layer having the concentrated layer was within a range from 0.02 to 0.4 μm according to the present invention, it was confirmed that both improvement of a wedge bonding property after 90 days of storage and a bonding property in the case of QFN mounting, and reduction of any chip damage were accomplished simultaneously. In contrast, according to example 59, because the outer layer had the thickness exceeding 0.4 μm, it was confirmed that a chip damage occurred. Preferably, according to examples 51, 53 to 57 and 60 having such thickness being within a range from 0.03 to 0.3 μm, a pull strength in the case of QFN mounting at a low temperature was improved, and more preferably, according to examples 51, 54 to 56 and 60 having such thickness being within a range from 0.04 to 0.25 μm, a high effect of further improving a pull strength in the case of QFN mounting at a low temperature was confirmed.

According to the multilayer wires of examples 61 to 70, as such wires each comprised the core member mainly composed of Cu, the outer layer formed on the core member and mainly composed of Pd, and the intermediate layer formed between the core member and the outer layer and containing at least either one of Ag and Au, and a total concentration of hydrogen contained in a whole wire was within a range from 0.0001 to 0.008 mass % according to the present invention, it was confirmed that a shear strength of a ball bonded part formed by a wire left for 120 days was good.

According to the multilayer wires of examples 61 to 70, as the intermediate layer had a concentration gradient of at least either one of Ag and Au according to the present invention, it was confirmed that a leaning characteristic in the case of reverse bonding mounting was improved. Preferably, according to examples 61 to 67, 69 and 70 having an average inclination of the concentration gradient per 1 μm being equal to or larger than 20 mol %, a high effect of further improving a leaning characteristic was confirmed.

According to the multilayer wires of examples 62, 63, 65 to 67, 69 and 70, as a maximum total concentration of Ag and Au in the intermediate layer was within a range from 30 to 90 mol % according to the present invention, it was confirmed that a successive bonding property by wedge bonding on a bump in the case of reverse bonding mounting was improved.

According to the multilayer wires of examples 61, 63 and 68, as the intermediate layer had a coexistence region of concentration gradients of at least three elements: at least either one of Ag and Au; Pd; and Cu according to the present invention, it was confirmed that a first pull strength in the case of reverse bonding mounting was improved.

According to the multilayer wires of examples 61 to 70, as a total thickness of the outer layer and the intermediate layer was within orange from 0.02 to 0.5 μm according to the present invention, it was confirmed that a second pull strength in the case of reverse bonding mounting of a mono chip type was improved. Preferably, according to examples 62 to 69 having such thickness being within a range from 0.07 to 0.4 μm, a high effect of further improving a second pull strength in the case of the mono chip type was confirmed. More preferably, according to examples 63, 65, 66, 68 and 69 having such thickness being within a range from 0.13 to 0.30 μm, a high effect of improving a second pull strength in the case of the over-hang type stacked chip was confirmed.

According to the multilayer wires of examples 51 to 54, 56 to 64 and 66 to 70, as such wires each comprised, at least either one of the surface concentrated layer or the intermediate layer, the outer layer, and the core member, and had a total concentration of Pd, Ag and Au being within a range from 0.4 to 4 mol % according to the present invention, an effect of suppressing any Al splash at a ball bonded part in the case of 50-μm pitch connection was confirmed. Preferably, according to examples 51, 53, 54, 56, 58, 59, 62 to 64 and 66 to 70 having such concentration being within a range from 0.5 to 3 mol %, any Al splash in the case of 40 μm pitch connection was suppressed, and more preferably, according to examples 51, 54, 56, 59, 62 to 64, 66, 67, 69 and 70 having such concentration being within a range from 0.7 to 2.7 mol %, a high effect of further suppressing any Al splash in the case of 40-μm pitch connection as confirmed.

According to the multilayer wires of examples 52 to 60, 62 to 64 and 66 to 70, as the foregoing total concentration of Pd, Ag and Au was within a range from 0.4 to 4 mol % and the ratio R of a total concentration of Ag and Au relative to the concentration of Pd was within a range from 0.001 to 0.4, it was confirmed that reduction of a bonding strength could be suppressed in the case of heating at 185° C. for 1500 hours which was a, high-temperature reliability for next-generation in-vehicle ICs. Preferably, according to examples 52 to 60, 63, 64, 66, 68, 69 and 70 each having the concentration ratio R being within a range from 0.002 to 0.3, a bonding reliability was good up to 2000 hours at a temperature of 185° C., and more preferably, according to examples 53 to 58, 60, 63, 64, 66, 69 and 70 each having the concentration ratio R being within a range from 0.01 to 0.25, a high effect of further improving a high-temperature bonding reliability up to 2500 hours at a temperature of 185° C. was confirmed.

TABLE 1

| | | Hydrogen concentration | | | Outer layer | | | | | |
| --- | --- | --- | --- | --- | --- | --- | --- | --- | --- | --- |
| | | Hydrogen concentration/ mass % | Ratio of concentration of hydrogen detected through TDS in range of 150 to 500° C. (%) | Main constituent | Layer thickness/ μm | Thickness where Pd concentration equal to or larger than 80%/ μm | Thickness of diffusion layer/ μm | Core member Main constituent | Additive element mol % | Manufacturing technique (A: Nonelectrolysis, B: Electrolysis, C: Vapor deposition) |
| Examples | 1 | 0.0001 | 60 | Pd | 0.01 | 0.001 | 0.003 | Cu | — | A |
| | 2 | 0.0002 | 98 | Pd | 0.06 | 0.02 | 0.03 | Cu | B0.0012 | B |
| | 3 | 0.0003 | 75 | Pd | 0.1 | 0.03 | 0.05 | Cu | — | B |
| | 4 | 0.0005 | 75 | Pd | 0.05 | 0.1 | 0.06 | Cu | Pd0.021 | B |
| | 5 | 0.0005 | 48 | Pd | 0.03 | 0.01 | 0.01 | Cu | P0.01 | B |
| | 6 | 0.0008 | 70 | Pd | 0.04 | 0.01 | 0.03 | Cu | B0.0003 | A |
| | 7 | 0.0011 | 70 | Pd | 0.08 | 0.04 | 0.04 | Cu | — | B |
| | 8 | 0.0018 | 58 | Pd | 0.1 | 0.03 | 0.05 | Cu | Pd0.2 | B |
| | 9 | 0.0022 | 92 | Pd | 0.06 | 0.02 | 0.08 | Cu | — | B |
| | 10 | 0.0039 | 45 | Pd | 0.093 | 0.03 | 0.11 | Cu | Ag0.01 | B |
| | 11 | 0.0042 | 72 | Pd | 0.15 | 0.06 | 0.07 | Cu | P0.001 | B |
| | 12 | 0.0062 | 53 | Pd | 0.12 | 0.04 | 0.16 | Cu | — | B |
| | 13 | 0.0078 | 65 | Pd | 0.19 | 0.09 | 0.14 | Cu | Zn0.01 | B |
| | 14 | 0.0006 | 56 | Pd | 0.05 | 0.01 | 0.05 | Cu | Al0.055 | B |
| | 15 | 0.0012 | 73 | Pd | 0.006 | 0 | 0.002 | Au | Al0.035 | C |
| | 16 | 0.0018 | 80 | Pd | 0.04 | 0.01 | 0.02 | Au | Ag0.02 | B |
| | 17 | 0.0042 | 53 | Pd | 0.098 | 0.03 | 0.08 | Au | — | B |
| | 18 | 0.0022 | 41 | Pd | 0.22 | 0.09 | 0.12 | Au | Pt1.0 | B |
| | 19 | 0.0005 | 76 | Pd | 0.02 | 0.002 | 0.04 | Ag | Pd1.8 | C |
| | 20 | 0.0018 | 55 | Pd | 0.09 | 0.04 | 0.09 | Ag | — | A |

TABLE 1-continued

| | | Hydrogen concentration | | Outer layer | | | Core member | | Manufacturing technique |
| --- | --- | --- | --- | --- | --- | --- | --- | --- | --- |
| | | Hydrogen concentration/ mass % | Ratio of concentration of hydrogen detected through TDS in range of 150 to 500° C. (%) | Main constituent | Layer thickness/ μm | Thickness where Pd concentration equal to or larger than 80%/ μm | Thickness of diffusion layer/ μm | Main constituent | Additive element mol % | (A: Nonelectrolysis, B: Electrolysis, C: Vapor deposition) |
| | 21 | 0.0043 | 42 | Pd | 0.13 | 0.07 | 0.17 | Ag | Pd 2.1 | B |
| Comparative example | 1 | 0.00005 | 95 | Pd | 0.01 | — | 0.01 | Cu | — | C |
| | 2 | 0.0082 | 60 | Pd | 0.02 | 0.01 | 0.01 | Cu | — | B |
| | 3 | 0.009 | 55 | Pd | 0.2 | 0.05 | 0.12 | Au | — | B |
| | 4 | 0.0085 | 38 | Pd | 0.18 | 0.07 | 0.08 | Ag | — | B |
| | 5 | 0.0005 | 75 | Au | 0.1 | 0.02 | 0.05 | Cu | — | B |
| | 6 | 0.0005 | 55 | Pd | 0.2 | 0.05 | 0.11 | Pt | — | A |
| | 7 | 0.0004 | — | — | — | — | — | Cu | — | — |

TABLE 2

| | | Ball formation | | Wire drawing workability | | Ball bonding | | | | 
| --- | --- | --- | --- | --- | --- | --- | --- | --- | --- |
| | | Sphericity | Bubble in side face of ball | 23 μm | 18 μm | Compressive bonded shape Wire diameter 23 μm | Wire diameter 18 μm | Shear strength | Chip damage |
| Examples | 1 | ◎ | ◎ | ◎ | ◎ | ◎ | ○ | ○ | ◎ |
| | 2 | ◎ | ◎ | ◎ | ◎ | ◎ | ◎ | ◎ | ◎ |
| | 3 | ◎ | ◎ | ◎ | ◎ | ◎ | ◎ | ○ | ◎ |
| | 4 | ◎ | ◎ | ◎ | ◎ | ◎ | ◎ | ◎ | ◎ |
| | 5 | ◎ | ◎ | ◎ | ○ | ○ | △ | ◎ | ◎ |
| | 6 | ◎ | ◎ | ◎ | ◎ | ◎ | ◎ | ◎ | ◎ |
| | 7 | ◎ | ◎ | ◎ | ◎ | ◎ | ◎ | ◎ | ◎ |
| | 8 | ◎ | ◎ | ◎ | ○ | ◎ | ○ | ○ | ◎ |
| | 9 | ◎ | ◎ | ○ | ○ | ◎ | ◎ | ◎ | ◎ |
| | 10 | ◎ | ◎ | ○ | ○ | ○ | △ | ◎ | ◎ |
| | 11 | ◎ | ○ | ○ | ○ | ◎ | ◎ | ○ | ○ |
| | 12 | ◎ | ○ | ○ | ○ | ◎ | ○ | ○ | ○ |
| | 13 | ◎ | ○ | ○ | ○ | ◎ | ○ | ○ | ○ |
| | 14 | ◎ | ◎ | ◎ | ◎ | ◎ | ○ | ◎ | ◎ |
| | 15 | ◎ | ◎ | ◎ | ◎ | ◎ | ○ | ○ | ◎ |
| | 16 | ◎ | ◎ | ◎ | ○ | ◎ | ○ | ○ | ◎ |
| | 17 | ◎ | ○ | ○ | ○ | ◎ | ○ | ○ | ◎ |
| | 18 | ◎ | ◎ | ○ | ○ | ○ | △ | ○ | ○ |
| | 19 | ◎ | ◎ | ◎ | ◎ | ◎ | ◎ | ◎ | ◎ |
| | 20 | ◎ | ◎ | ◎ | ○ | ◎ | ○ | ◎ | ◎ |
| | 21 | ◎ | ○ | ○ | ○ | ○ | △ | ○ | ○ |
| Comparative example | 1 | X | ○ | X | X | ○ | ○ | △ | ◎ |
| | 2 | X | X | X | X | △ | △ | △ | ○ |
| | 3 | X | X | X | X | △ | △ | X | X |
| | 4 | X | X | X | X | △ | △ | △ | △ |
| | 5 | △ | △ | △ | X | X | X | X | ○ |
| | 6 | △ | X | △ | X | △ | △ | X | △ |
| | 7 | ○ | ◎ | △ | X | △ | △ | ◎ | ◎ |

| | | Loop linearity | | Pull strength | Loop stability | Wedge bonding property | | Peel bonding strength | Leaning characteristic | PCT reliability |
| --- | --- | --- | --- | --- | --- | --- | --- | --- | --- | --- |
| | | Span 2 mm | Span 5 mm | | | Initially | After left for 60 days | | | |
| Examples | 1 | ◎ | ○ | ○ | ◎ | ◎ | ◎ | ◎ | ○ | ○ |
| | 2 | ◎ | ◎ | ◎ | ◎ | ◎ | ◎ | ◎ | ◎ | ○ |
| | 3 | ◎ | ◎ | ◎ | ◎ | ◎ | ◎ | ◎ | ○ | ○ |

TABLE 2-continued

| | | | | | | | | | | | |
|---|---|---|---|---|---|---|---|---|---|---|---|
| | 4 | ◎ | ◎ | ◎ | ◎ | ◎ | ◎ | ◎ | ◎ | ○ | ◎ |
| | 5 | ◎ | ◎ | ◎ | ◎ | ◎ | ◎ | ◎ | ◎ | ◎ | ○ |
| | 6 | ◎ | ◎ | ◎ | ◎ | ◎ | ◎ | ◎ | ◎ | ◎ | ○ |
| | 7 | ◎ | ◎ | ◎ | ◎ | ◎ | ◎ | ◎ | ◎ | ○ | ○ |
| | 8 | ◎ | ◎ | ◎ | ◎ | ◎ | ◎ | ◎ | ◎ | ○ | ◎ |
| | 9 | ◎ | ◎ | ◎ | ◎ | ◎ | ◎ | ◎ | ◎ | ○ | ○ |
| | 10 | ◎ | ○ | ◎ | ◎ | ◎ | ◎ | ◎ | ◎ | ○ | ◎ |
| | 11 | ◎ | ◎ | ◎ | ◎ | ◎ | ◎ | ◎ | ◎ | ◎ | ○ |
| | 12 | ○ | ○ | ◎ | ◎ | ○ | ◎ | ◎ | ◎ | ○ | ○ |
| | 13 | ◎ | ○ | ○ | ○ | ◎ | ◎ | ◎ | ◎ | ◎ | ○ |
| | 14 | ◎ | ◎ | ◎ | ◎ | ◎ | ◎ | ◎ | △ | ○ | ○ |
| | 15 | ○ | ○ | ○ | ○ | ◎ | ◎ | ○ | ◎ | ○ | ○ |
| | 16 | ◎ | ◎ | ◎ | ◎ | ◎ | ◎ | ◎ | ◎ | ○ | ◎ |
| | 17 | ◎ | ◎ | ◎ | ◎ | ◎ | ◎ | ◎ | ◎ | ○ | ○ |
| | 18 | ◎ | ○ | ○ | ○ | ◎ | ○ | ◎ | ◎ | ○ | ◎ |
| | 19 | ◎ | ◎ | ○ | ◎ | ◎ | ◎ | ◎ | ◎ | ○ | ◎ |
| | 20 | ◎ | ◎ | ◎ | ◎ | ◎ | ◎ | ◎ | ◎ | ○ | ○ |
| | 21 | ○ | ○ | ◎ | ◎ | ○ | ◎ | ◎ | ◎ | ○ | ○ |
| Com- | 1 | △ | △ | △ | ○ | △ | △ | ○ | ○ | ○ | ○ |
| par- | 2 | ○ | △ | ○ | ○ | ◎ | ◎ | ○ | ○ | ○ | ○ |
| ative | 3 | △ | × | ◎ | ○ | ◎ | ◎ | ○ | ○ | ○ | ○ |
| example | 4 | ○ | △ | ◎ | △ | ◎ | ◎ | ○ | ○ | ○ | ○ |
| | 5 | ○ | △ | ○ | ○ | ◎ | ◎ | ◎ | ○ | ○ | △ |
| | 6 | △ | × | ◎ | △ | △ | △ | ○ | △ | ○ | △ |
| | 7 | ○ | △ | △ | ○ | △ | △ | △ | ○ | ○ | △ |

TABLE 3

| | | Hydrogen concentration | | Outer layer | | | | | | | |
|---|---|---|---|---|---|---|---|---|---|---|---|
| | | | Ratio of concentration of hydrogen detected through TDS in range of 150 to 500° C. (%) | Surface concentrated layer | | | Single-metal layer | | | Main constituent of outer layer | Thickness of outer layer/ μm |
| | | Hydrogen concen- tration/ mass % | | Concen- trated constituent | Pd concen- tration/ mol % of outermost surface layer | Concen- tration gradient | Element | Position | Thickness/ μm | | |
| Examples | 51 | 0.0001 | 58 | Au | 19 | B | Pd | Interior | 0.08 | Pd | 0.15 |
| | 52 | 0.0003 | 97 | Ag | 21 | A | Pd | Interior | 0.007 | pd | 0.02 |
| | 53 | 0.0005 | 73 | Au | 45 | A | Pd | Interior | 0.02 | Pd | 0.03 |
| | 54 | 0.0008 | 93 | Ag | 60 | A | Pd | Interior | 0.04 | Pd | 0.07 |
| | 55 | 0.0013 | 51 | Au | 65 | A | Pd | Interior | 0.06 | Pd | 0.12 |
| | 56 | 0.0025 | 75 | Ag | 70 | A | Pd | Interior | 0.07 | Pd | 0.2 |
| | 57 | 0.0038 | 68 | Au | 78 | A | Pd | Interior | 0.1 | Pd | 0.28 |
| | 58 | 0.0045 | 52 | Ag | 79 | A | — | — | — | Pd | 0.32 |
| | 59 | 0.007 | 48 | Au, Ag | 95 | A | — | — | — | Pd | 0.42 |
| | 60 | 0.0015 | 85 | Au | 85 | A | Pd | Interior | 0.11 | Pd | 0.24 |
| | 61 | 0.0002 | 68 | — | — | — | — | — | — | Pd | 0.01 |
| | 62 | 0.0004 | 98 | — | — | — | — | — | — | Pd | 0.04 |
| | 63 | 0.0006 | 88 | — | — | — | Pd | Surface | 0.03 | Pd | 0.1 |
| | 64 | 0.0008 | 71 | — | — | — | Pd | Surface | 0.02 | Pd | 0.07 |
| | 65 | 0.0014 | 80 | — | — | — | Pd | Surface | 0.08 | Pd | 0.13 |
| | 66 | 0.0021 | 63 | — | — | — | Pd | Surface | 0.04 | Pd | 0.14 |
| | 67 | 0.0027 | 51 | — | — | — | Pd | Surface | 0.01 | Pd | 0.12 |
| | 68 | 0.0042 | 48 | — | — | — | Pd | Surface | 0.01 | Pd | 0.24 |
| | 69 | 0.0016 | 79 | — | — | — | Pd | Surface | 0.06 | Pd | 0.12 |
| | 70 | 0.0012 | 90 | — | — | — | Pd | Surface | 0.05 | Pd | 0.13 |
| | 71 | 0.0003 | 95 | — | — | — | Pd | Surface | 0.04 | Pd | 0.16 |
| | 72 | 0.0015 | 70 | — | — | — | Pd | Surface | 0.1 | Pd | 0.27 |
| Comparative examples | 51 | 0.00005 | 95 | Au | 45 | A | — | — | — | Pd | 0.08 |
| | 52 | 0.0083 | 60 | Ag | 75 | A | Pd | Surface | 0.12 | Pd | 0.28 |
| | 53 | 0.003 | 55 | Rh | 55 | A | Pd | Surface | 0.02 | Pt | 0.15 |
| | 54 | 0.00008 | 38 | — | — | — | — | — | — | Pd | 0.07 |

TABLE 3-continued

| | | | | | | | | | | |
|---|---|---|---|---|---|---|---|---|---|---|
| 55 | 0.009 | 75 | — | — | — | Pd | Surface | 0.06 | Pd | 0.15 |
| 56 | 0.002 | 55 | — | — | — | Ni | Surface | 0.01 | Ni | 0.08 |

| | | Intermediate layer | | | | Total thickness of outer layer and intermediate layer/ μm | Core member Main constituent of core member | Total concentration of Pd, Au, Ag in wire/ mol % | Concentration ratio R of (Ag + Au)/ Pd | Wire diameter/ μm |
|---|---|---|---|---|---|---|---|---|---|---|
| | | Concentrated constituent | Concentration gradient | Maximum concentration/ mol % | Coexistence of concentration gradient of three elements | | | | | |
| Examples | 51 | — | — | — | — | — | Cu | 1.3 | 0.0008 | 20 |
| | 52 | — | — | — | — | — | Cu | 0.41 | 0.004 | 20 |
| | 53 | — | — | — | — | — | Cu | 0.51 | 0.01 | 20 |
| | 54 | — | — | — | — | — | Cu | 0.75 | 0.15 | 20 |
| | 55 | — | — | — | — | — | Cu | 0.23 | 0.02 | 20 |
| | 56 | — | — | — | — | — | Cu | 1.54 | 0.04 | 20 |
| | 57 | — | — | — | — | — | Cu | 3.2 | 0.12 | 20 |
| | 58 | — | — | — | — | — | Cu | 0.55 | 0.24 | 20 |
| | 59 | — | — | — | — | — | Cu | 0.72 | 0.29 | 20 |
| | 60 | — | — | — | — | — | Cu | 3.2 | 0.15 | 20 |
| | 61 | Ag | A | 28 | ○ | 0.02 | Cu | 0.42 | 0.42 | 20 |
| | 62 | Au | A | 35 | — | 0.07 | Cu | 0.78 | 0.33 | 20 |
| | 63 | Ag | A | 43 | ○ | 0.13 | Cu | 1.23 | 0.12 | 20 |
| | 64 | Au | A | 92 | — | 0.1 | Cu | 0.73 | 0.17 | 20 |
| | 65 | Ag | A | 88 | — | 0.24 | Cu | 4.2 | 0.6 | 20 |
| | 66 | Au | A | 70 | — | 0.26 | Cu | 2.6 | 0.02 | 20 |
| | 67 | Ag | A | 64 | — | 0.32 | Cu | 0.93 | 0.38 | 20 |
| | 68 | Au | B | 22 | ○ | 0.28 | Cu | 0.54 | 0.002 | 20 |
| | 69 | Ag | A | 40 | — | 0.26 | Cu | 0.88 | 0.03 | 20 |
| | 70 | Au | A | 43 | — | 0.42 | Cu | 1.58 | 0.08 | 20 |
| | 71 | — | — | — | — | — | Cu | 0.82 | 0 | 20 |
| | 72 | — | — | — | — | — | Cu | 1.54 | 0 | 20 |
| Comparative examples | 51 | — | — | — | — | — | Cu | 0.15 | 0.02 | 20 |
| | 52 | — | — | — | — | — | Cu | 3.8 | 0.0005 | 20 |
| | 53 | — | — | — | — | — | Cu | 0.55 | 0.07 | 20 |
| | 54 | — | — | — | — | — | Cu | 0.68 | 0.13 | 20 |
| | 55 | — | — | — | — | — | Cu | 4.2 | 0.43 | 20 |
| | 56 | — | — | — | — | — | Cu | 0.59 | 0.23 | 20 |

TABLE 4

| | | Ball formation | | Ball bonding | | | | | | | | |
|---|---|---|---|---|---|---|---|---|---|---|---|---|
| | | Sphericity | Bubble in side face of ball | Wire drawing workability | | Compressive bonded shape | | Large ball deformation characteristic | Ball/ shear strength of wire stocked for 120 days | Shear strength | Chip damage | Al splash in fine diameter bonding | |
| | | | | 23 μm | 18 μm | Wire diameter 23 μm | Wire diameter 18 μm | | | | | 50 μm Diameter | 40 μm Diameter |
| Examples | 51 | ◎ | ◎ | ◎ | ◎ | ◎ | ○ | ◎ | ○ | ○ | ◎ | ◎ | ◎ |
| | 52 | ◎ | ◎ | ◎ | ◎ | ◎ | ◎ | ◎ | ◎ | ◎ | ◎ | ◎ | Δ |
| | 53 | ◎ | ◎ | ◎ | ◎ | ◎ | ◎ | ◎ | ◎ | ◎ | ◎ | ◎ | ○ |
| | 54 | ◎ | ◎ | ◎ | ◎ | ◎ | ◎ | ◎ | ◎ | ◎ | ◎ | ◎ | ◎ |
| | 55 | ◎ | ◎ | ◎ | ◎ | ◎ | ○ | ◎ | ◎ | ◎ | ◎ | ○ | Δ |
| | 56 | ◎ | ◎ | ◎ | ○ | ○ | ◎ | ◎ | ◎ | ◎ | ◎ | ◎ | ◎ |
| | 57 | ◎ | ◎ | ◎ | ○ | ○ | ◎ | ○ | ◎ | ○ | ◎ | ◎ | Δ |
| | 58 | ◎ | Δ | Δ | Δ | ◎ | ○ | Δ | ◎ | ◎ | ◎ | ◎ | ○ |
| | 59 | ◎ | Δ | Δ | Δ | ○ | Δ | Δ | ◎ | ◎ | ◎ | Δ | ◎ |
| | 60 | ◎ | ◎ | ◎ | ○ | ◎ | ◎ | ◎ | ○ | ◎ | ◎ | ◎ | Δ |
| | 61 | ◎ | ◎ | ◎ | ◎ | ◎ | ○ | Δ | ◎ | ◎ | ◎ | ◎ | Δ |
| | 62 | ◎ | ◎ | ◎ | ◎ | ◎ | ◎ | Δ | ◎ | ◎ | ◎ | ◎ | ◎ |
| | 63 | ◎ | ◎ | ◎ | ◎ | ◎ | ◎ | Δ | ◎ | ◎ | ◎ | ◎ | ◎ |
| | 64 | ◎ | ◎ | ◎ | ◎ | ◎ | ◎ | Δ | ◎ | ◎ | ◎ | ◎ | ◎ |
| | 65 | ◎ | ◎ | ◎ | ○ | ◎ | ◎ | Δ | ◎ | ◎ | ◎ | ○ | Δ |
| | 66 | ◎ | ◎ | ◎ | ○ | ◎ | ◎ | Δ | ◎ | ◎ | ◎ | ◎ | ◎ |
| | 67 | ◎ | ◎ | ◎ | ○ | ○ | ◎ | ○ | Δ | ◎ | ◎ | ◎ | ◎ |

TABLE 4-continued

|  |  | | | | | | | | | | | | | |
|---|---|---|---|---|---|---|---|---|---|---|---|---|---|---|
|  | 68 | ⊚ | △ | △ | △ | ○ | △ | △ | ⊚ | ⊚ | ⊚ | ⊚ | ⊚ | ○ |
|  | 69 | ⊚ | ⊚ | ⊚ | ○ | ⊚ | ⊚ | △ | ⊚ | ⊚ | ⊚ | ⊚ | ⊚ | ⊚ |
|  | 70 | ⊚ | ⊚ | ⊚ | ○ | ⊚ | ⊚ | △ | ⊚ | ⊚ | ⊚ | ⊚ | ⊚ | ⊚ |
|  | 71 | ⊚ | ⊚ | ⊚ | ⊚ | ⊚ | ⊚ | △ | ○ | ⊚ | ⊚ | ⊚ | ⊚ | ⊚ |
|  | 72 | ⊚ | ⊚ | ⊚ | ○ | ⊚ | ⊚ | △ | ○ | ⊚ | ⊚ | ⊚ | ⊚ | ⊚ |
| Comparative | 51 | X | X | X | X | △ | X | X | ○ | ○ | ⊚ | ⊚ | ⊚ | ⊚ |
| examples | 52 | X | X | X | X | △ | X | X | △ | ○ | ⊚ | ○ | ○ | ○ |
|  | 53 | △ | △ | X | X | △ | X | X | △ | △ | ⊚ | △ | ⊚ | X |
|  | 54 | X | X | X | X | △ | X | X | ○ | ○ | ⊚ | ⊚ | ⊚ | ⊚ |
|  | 55 | X | X | X | X | △ | X | X | △ | ○ | ⊚ | ○ | ○ | ○ |
|  | 56 | △ | △ | △ | X | △ | X | X | X | X | ⊚ | X | X | X |

| | | Wedge bonding property | | QFN mounting Second pull strength | | | Wrinkled failure in long span | | Reverse bonding | | | | | | High temperature reliability Heating at 185° C. | | |
|---|---|---|---|---|---|---|---|---|---|---|---|---|---|---|---|---|---|
| | | Initially | After left for 90 days | Successive bonding property | Normal temperature | Low temperature | 20 μm Diameter | 18 μm Diameter | Successive bonding property | First pull strength | Mono chip type | Over-hang type | Leaning characteristic | Second pull strength | 1500 h | 2000 h | 2500 h |
| Examples | 51 | ⊚ | ⊚ | ○ | ⊚ | ⊚ | △ | △ | ○ | ○ | △ | △ | △ | ○ | ○ | ○ | △ |
|  | 52 | ⊚ | ⊚ | ⊚ | ⊚ | △ | ⊚ | ○ | ○ | ○ | △ | △ | △ | ⊚ | ⊚ | ⊚ | ○ |
|  | 53 | ⊚ | ⊚ | ⊚ | ⊚ | ○ | ⊚ | ⊚ | ○ | ○ | △ | △ | △ | ⊚ | ⊚ | ⊚ | ⊚ |
|  | 54 | ⊚ | ⊚ | ⊚ | ⊚ | ⊚ | ⊚ | ⊚ | ○ | ○ | △ | △ | △ | ⊚ | ⊚ | ⊚ | ⊚ |
|  | 55 | ⊚ | ⊚ | ⊚ | ⊚ | ⊚ | ⊚ | ⊚ | ○ | ○ | △ | △ | △ | ⊚ | ⊚ | ⊚ | ⊚ |
|  | 56 | ⊚ | ⊚ | ⊚ | ⊚ | ⊚ | ⊚ | ⊚ | ○ | ○ | △ | △ | △ | ⊚ | ⊚ | ⊚ | ⊚ |
|  | 57 | ⊚ | ⊚ | ⊚ | ⊚ | ○ | ⊚ | ⊚ | ○ | ○ | △ | △ | △ | ⊚ | ⊚ | ⊚ | ⊚ |
|  | 58 | ⊚ | ⊚ | ⊚ | ⊚ | △ | ⊚ | ⊚ | ○ | ○ | △ | △ | △ | ⊚ | ⊚ | ⊚ | ⊚ |
|  | 59 | ⊚ | ⊚ | ⊚ | ○ | △ | ○ | △ | ○ | ○ | △ | △ | △ | ⊚ | ⊚ | ⊚ | ○ |
|  | 60 | ⊚ | ⊚ | ⊚ | ⊚ | ⊚ | ⊚ | ○ | ○ | ○ | △ | △ | △ | ⊚ | ⊚ | ⊚ | ⊚ |
|  | 61 | ⊚ | ○ | △ | ○ | △ | △ | △ | ○ | ⊚ | ○ | △ | ⊚ | ○ | ○ | △ | △ |
|  | 62 | ⊚ | ○ | △ | ⊚ | ⊚ | △ | △ | ⊚ | ○ | ⊚ | ○ | ⊚ | ⊚ | ⊚ | ○ | △ |
|  | 63 | ⊚ | ○ | △ | ⊚ | ⊚ | △ | △ | ⊚ | ○ | ⊚ | ⊚ | ⊚ | ⊚ | ⊚ | ⊚ | ⊚ |
|  | 64 | ⊚ | ○ | △ | ⊚ | ⊚ | △ | △ | ⊚ | ○ | ⊚ | ⊚ | ⊚ | ⊚ | ⊚ | ⊚ | ⊚ |
|  | 65 | ⊚ | ○ | △ | ⊚ | ⊚ | △ | △ | ⊚ | ○ | ⊚ | ⊚ | ⊚ | ○ | ⊚ | △ | △ |
|  | 66 | ⊚ | ○ | △ | ⊚ | ⊚ | △ | △ | ⊚ | ○ | ⊚ | ⊚ | ⊚ | ⊚ | ⊚ | ⊚ | ⊚ |
|  | 67 | ⊚ | ○ | △ | ⊚ | ⊚ | △ | △ | ⊚ | ○ | ⊚ | ⊚ | ⊚ | ⊚ | ⊚ | ○ | △ |
|  | 68 | ⊚ | ○ | △ | ⊚ | ⊚ | △ | △ | ○ | ⊚ | ⊚ | ⊚ | ○ | ⊚ | ⊚ | ⊚ | ○ |
|  | 69 | ⊚ | ○ | △ | ⊚ | ⊚ | △ | △ | ⊚ | ○ | ⊚ | ⊚ | ⊚ | ⊚ | ⊚ | ⊚ | ⊚ |
|  | 70 | ⊚ | ○ | △ | ⊚ | ⊚ | △ | △ | ⊚ | ○ | ○ | ○ | ⊚ | ⊚ | ⊚ | ⊚ | ⊚ |
|  | 71 | ⊚ | △ | △ | △ | △ | △ | △ | ○ | △ | △ | △ | △ | ○ | △ | △ | △ |
|  | 72 | ⊚ | △ | △ | △ | △ | △ | △ | ○ | △ | △ | △ | △ | ○ | △ | △ | △ |
| Comparative examples | 51 | ⊚ | X | △ | △ | △ | ○ | ○ | △ | △ | △ | △ | △ | ○ | △ | △ | △ |
|  | 52 | ○ | X | △ | △ | △ | △ | △ | △ | △ | △ | △ | △ | ○ | △ | X | X |
|  | 53 | △ | X | X | X | X | △ | X | △ | △ | △ | △ | X | X | ○ | △ | △ |
|  | 54 | ⊚ | ⊚ | △ | △ | △ | △ | △ | △ | △ | △ | △ | △ | ○ | △ | △ | △ |
|  | 55 | ○ | △ | △ | △ | △ | △ | △ | △ | △ | △ | △ | △ | ○ | X | X | X |
|  | 56 | △ | X | X | X | X | △ | X | X | △ | X | X | △ | △ | △ | △ | X |

DESCRIPTION OF REFERENCE NUMERALS

1 Core

2 Outer layer

3 Diffusion layer

4 Surface concentrated layer

5 Single-metal layer in outer layer

6 Intermediate layer

7 Total thickness of outer layer and intermediate layer

8 Concentration gradient where at least three elements are mixed

A Main constituent of outer layer

B Main constituent of core member

C Main constituent of surface concentrated layer

D Main constituent of intermediate layer

The invention claimed is:

1. A semiconductor bonding wire comprising:
a core member mainly composed of at least any one of Cu, Au and Ag;
an outer layer formed on the core member and mainly composed of Pd,
wherein a total concentration of hydrogen contained in a whole wire is within a range from 0.0001 to 0.004 mass %.

2. The semiconductor bonding wire according to claim 1, wherein the total concentration of hydrogen is within a range from 0.0001 to 0.0008 mass %.

3. The semiconductor bonding wire according to claim 1, wherein the total concentration of hydrogen is a concentration of hydrogen contained in the bonding wire measured by Thermal Desorption Spectrometry (TDS).

4. The semiconductor bonding wire according to claim 1, wherein in a Thermal Desorption Spectrometry (TDS) measurement at a temperature rising speed of 100 to 300° C./h, a ratio of a concentration of hydrogen, detected within a temperature range from 150 to 500° C. in TDS, to the total concentration of hydrogen detected within a temperature range from a room temperature to 900° C. is equal to or larger than 50%.

5. The semiconductor bonding wire according to claim 1, wherein the outer layer has a thickness being within a range from 0.01 to 0.2 μm.

6. The semiconductor bonding wire according to claim 1, wherein in the outer layer, a region having a concentration of Pd relative to a total concentration of metal elements being equal to or larger than 80 mol % has a thickness of 0.003 to 0.08 μm.

7. The semiconductor bonding wire according to claim 1, further comprising a diffusion layer formed between the outer layer and the core member and having a concentration gradient,
wherein the diffusion layer has a thickness of 0.003 to 0.15 μm.

8. The semiconductor bonding wire according to claim 1, wherein the main constituent of the core member is Cu or Au, and the core member also contains at least one of Pd, Ag and Pt as an element, and a total concentration of the elements in the core member is within a range from 0.01 to 2 mol %.

9. The semiconductor bonding wire according to claim 1, wherein the main constituent of the core member is Cu, and the core member contains at least one of Al, Sn, Zn, B and P as an element for alloy, and a total concentration of the elements for alloy in a whole wire is within a range from 0.0001 to 0.05 mol %.

10. The semiconductor bonding wire according to claim 1, wherein
the core member is mainly composed of Cu, and
the semiconductor bonding wire further comprises a concentrated layer formed at an outer surface side of the outer layer and containing at least either one of Ag and Au.

11. The semiconductor bonding wire according to claim 10, wherein the concentrated layer has a concentration gradient of at least either one of Ag and Au, in a wire diameter direction.

12. The semiconductor bonding wire according to claim 10, wherein a concentration of Pd at an outermost surface of the concentrated layer is within a range from 20 to 90 mol %.

13. The semiconductor bonding wire according to claim 10, further comprising a Pd single-metal layer in the outer layer.

14. The semiconductor bonding wire according to claim 10, wherein the outer layer including the concentrated layer has a thickness of 0.02 to 0.4 μm.

15. The semiconductor bonding wire according to claim 10, wherein a total concentration of Pd, Ag and Au is within a range from 0.4 to 4 mol %.

16. The semiconductor bonding wire according to claim 10, wherein a ratio of a total concentration of Ag and Au to a concentration of Pd is within a range from 0.001 to 0.4.

17. The semiconductor bonding wire according to claim 1, wherein the core member is mainly composed of Cu,
the semiconductor bonding wire further comprises an intermediate layer formed between the core member and the outer layer, and wherein
at least either one of Ag and Au is concentrated in the intermediate layer.

18. The semiconductor bonding wire according to claim 17, wherein the intermediate layer has a concentration gradient of at least either one of Ag and Au, in a wire diameter direction.

19. The semiconductor bonding wire according to claim 18, wherein the intermediate layer includes a region where Pd, Cu, and at least either one of Ag and Au coexist, the region having a concentration gradient of at least three of the elements in a wire diameter direction.

20. The semiconductor bonding wire according to claim 17, wherein a maximum total concentration of Ag and Au in the intermediate layer is within a range from 30 to 90 mol %.

21. The semiconductor bonding wire according to claim 17, wherein a total thickness of the outer layer and the intermediate layer is within a range from 0.02 to 0.5 μm.

* * * * *